(12) United States Patent
Yu et al.

(10) Patent No.: US 12,020,997 B2
(45) Date of Patent: Jun. 25, 2024

(54) METHODS OF FORMING SEMICONDUCTOR DEVICE PACKAGES HAVING ALIGNMENT MARKS ON A CARRIER SUBSTRATE

(71) Applicant: Taiwan Semiconductor Manufacturing Company, Ltd., Hsinchu (TW)

(72) Inventors: Chen-Hua Yu, Hsinchu (TW); Sung-Feng Yeh, Taipei (TW); Ming-Fa Chen, Taichung (TW); Hsien-Wei Chen, Hsinchu (TW); Hui-Wen Liu, Hsinchu (TW); Ching-Pin Yuan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/338,726

(22) Filed: Jun. 21, 2023

(65) Prior Publication Data

US 2023/0352352 A1 Nov. 2, 2023

Related U.S. Application Data

(60) Continuation of application No. 17/722,935, filed on Apr. 18, 2022, now Pat. No. 11,721,598, which is a
(Continued)

(51) Int. Cl.
*H01L 21/56* (2006.01)
*H01L 21/66* (2006.01)
(Continued)

(52) U.S. Cl.
CPC .............. *H01L 22/32* (2013.01); *H01L 21/56* (2013.01); *H01L 22/22* (2013.01); *H01L 22/34* (2013.01); *H01L 23/3121* (2013.01); *H01L 23/544* (2013.01); *H01L 24/09* (2013.01); *H01L 24/17* (2013.01); *H01L 25/0657* (2013.01); *H01L 2223/54426* (2013.01); *H01L 2225/06517* (2013.01)

(58) Field of Classification Search
CPC ......... H01L 21/56; H01L 22/22; H01L 22/32; H01L 22/34; H01L 23/3125; H01L 23/544; H01L 24/09; H01L 24/17; H01L 25/0657; H01L 2223/54426; H01L 2225/06517
USPC ...................................... 438/11, 14
See application file for complete search history.

(56) References Cited

U.S. PATENT DOCUMENTS 8,552,567 B2  10/2013  England et al.
8,802,504 B1   8/2014  Hou et al.
(Continued)

FOREIGN PATENT DOCUMENTS

CN  102820283 A  12/2012
CN  103325772 A   9/2013
(Continued)

*Primary Examiner* — Hoai V Pham
(74) *Attorney, Agent, or Firm* — Slater Matsil, LLP

(57) ABSTRACT

In an embodiment, a method includes: stacking a plurality of first dies to form a device stack; revealing testing pads of a topmost die of the device stack; testing the device stack using the testing pads of the topmost die; and after testing the device stack, forming bonding pads in the topmost die, the bonding pads being different from the testing pads.

20 Claims, 32 Drawing Sheets

Related U.S. Application Data continuation of application No. 16/889,348, filed on Jun. 1, 2020, now Pat. No. 11,309,223, which is a division of application No. 16/023,504, filed on Jun. 29, 2018, now Pat. No. 10,672,674.

(51) Int. Cl.
   *H01L 23/00*    (2006.01)
   *H01L 23/31*    (2006.01)
   *H01L 23/544*   (2006.01)
   *H01L 25/065*   (2023.01)

(56) References Cited

U.S. PATENT DOCUMENTS

| | | |
|---|---|---|
| 8,803,292 B2 | 8/2014 | Chen et al. |
| 8,803,316 B2 | 8/2014 | Lin et al. |
| 8,993,380 B2 | 3/2015 | Hou et al. |
| 9,281,254 B2 | 3/2016 | Yu et al. |
| 9,299,649 B2 | 3/2016 | Chiu et al. |
| 9,496,189 B2 | 3/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 10,115,663 B2 * | 10/2018 | Or-Bach ............. H01L 25/0657 |
| 2004/0173794 A1 | 9/2004 | Yu et al. |
| 2007/0126085 A1 | 6/2007 | Kawano et al. |
| 2010/0244233 A1 | 9/2010 | Kim et al. |
| 2011/0026232 A1 | 2/2011 | Lin et al. |
| 2012/0074976 A1 | 3/2012 | Durbin et al. |
| 2012/0314511 A1 | 12/2012 | Ishikawa |
| 2013/0250298 A1 | 9/2013 | Komuta et al. |
| 2015/0037914 A1 | 2/2015 | Takahashi et al. |
| 2015/0279431 A1 | 10/2015 | Li et al. |
| 2016/0013148 A1 | 1/2016 | Lin et al. |
| 2017/0170081 A1 | 6/2017 | Byun et al. |
| 2018/0138101 A1 | 5/2018 | Yu et al. |
| 2018/0158749 A1 | 6/2018 | Yu et al. |
| 2019/0287872 A1 | 9/2019 | Goh et al. |

FOREIGN PATENT DOCUMENTS

| | | |
|---|---|---|
| CN | 108074872 A | 5/2018 |
| KR | 20130102948 A | 9/2013 |
| KR | 20140034909 A | 3/2014 |
| KR | 20190034358 A | 4/2019 |

* cited by examiner

310

310

310

310

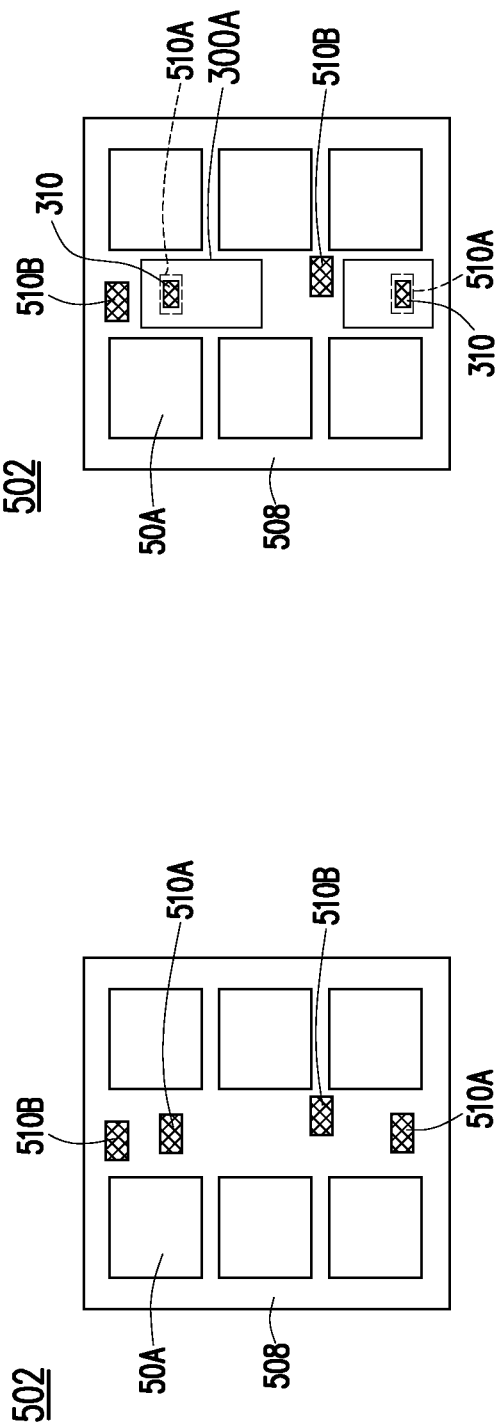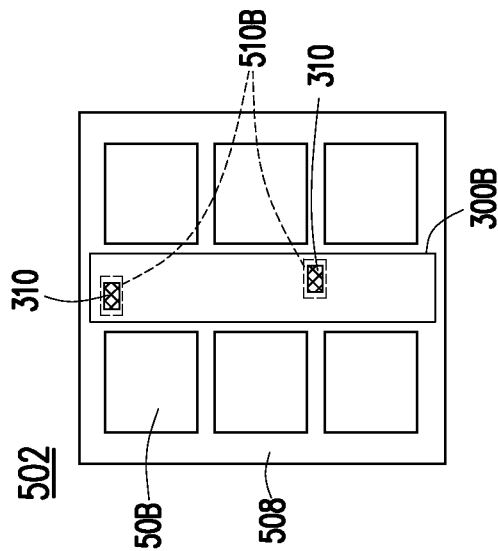

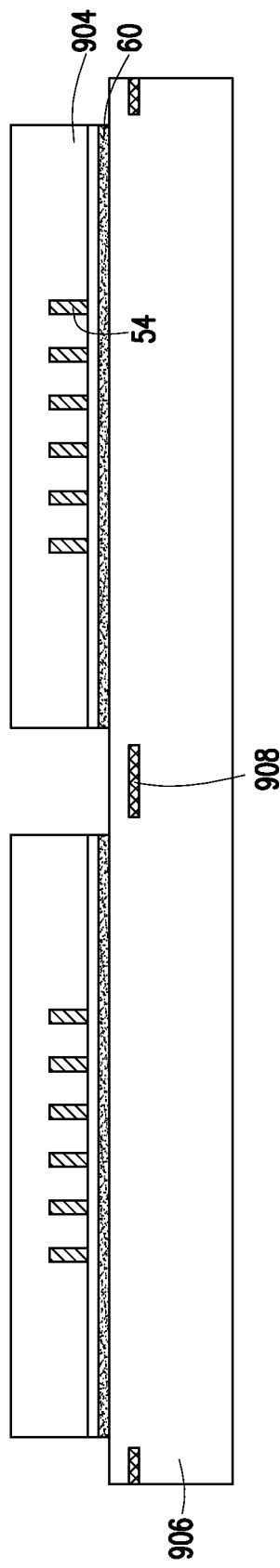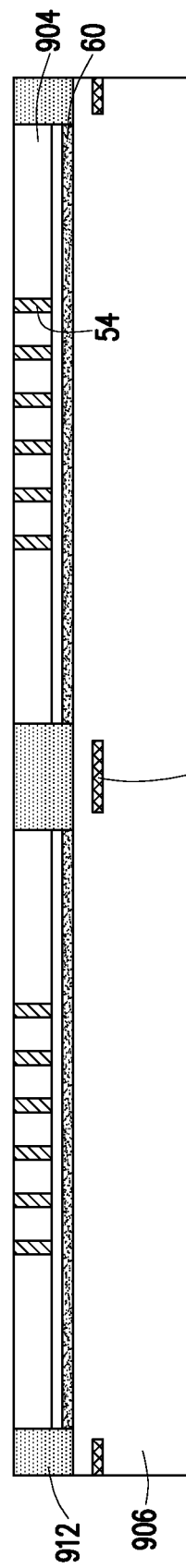
FIG. 9A
FIG. 9B

METHODS OF FORMING SEMICONDUCTOR DEVICE PACKAGES HAVING ALIGNMENT MARKS ON A CARRIER SUBSTRATE

PRIORITY CLAIM AND CROSS-REFERENCE

This application is a continuation of U.S. patent application Ser. No. 17/722,935, entitled "Method of Forming Semiconductor Device Package Having Testing Pads on an Upper Die," filed on Apr. 18, 2022, which is a continuation of U.S. patent application Ser. No. 16/889,348, entitled "Method of Forming Semiconductor Device Package Having Dummy Devices on a First Die," filed on Jun. 1, 2020, now U.S. Pat. No. 11,309,223, issued on Apr. 19, 2022, which is a division of U.S. patent application Ser. No. 16/023,504, entitled "Method of Forming Semiconductor Device Package Having Testing Pads on a Topmost Die," filed on Jun. 29, 2018, now U.S. Pat. No. 10,672,674, issued on Jun. 2, 2020, which applications are incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip directly onto a substrate. Interposers have been used to redistribute ball contact areas from that of the chip to a larger area of the interposer. Further, interposers have allowed for a three-dimensional (3D) package that includes multiple chips. Other packages have also been developed to incorporate 3D aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A through 7C are top-down views showing a device stack at different stages of manufacturing, in accordance with various embodiments.

FIGS. 9A through 9H are various views of intermediate steps during a process for forming device packages, in accordance with some embodiments.

DETAILED DESCRIPTION

Figure 1:
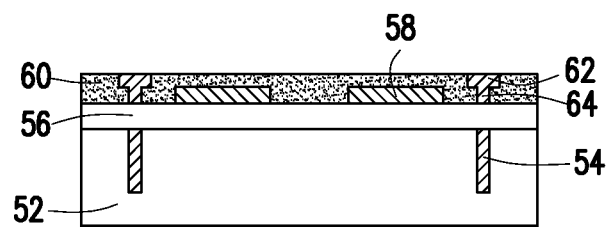
FIG. 1 is a cross-sectional view of an integrated circuit device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to some embodiments, a device stack is formed on a carrier substrate. The device stack may be, e.g., a memory cube comprising multiple memory dies. The device stack is then removed from the carrier substrate, and tested using dedicated testing pads. Only known good device stacks are used for subsequent processing, which may increase manufacturing yield. Further, in some embodiments, dummy devices are added to the layers of the device stack. The dummy devices may improve the thermal dissipation of the device stack. Finally, in some embodiments, the dummy devices include alignment marks. By using the dummy devices for alignment, alignment marks may be omitted from the dies of the device stack, which may increase the available routing area of the dies.

FIG. 1 is a cross-sectional view of an integrated circuit device 50, in accordance with some embodiments. The integrated circuit device 50 may be a logic die (e.g., central processing unit (CPU), graphics processing unit (GPU), system-on-a-chip (SoC), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or a combination thereof. The integrated circuit device 50 may be formed in a wafer (not shown), which may include different device regions that are singulated in subsequent steps to form a plurality of integrated circuit devices 50. The integrated circuit devices 50 will be stacked to form a device package in subsequent processing. The integrated circuit device 50 includes a substrate 52, conductive vias 54, an interconnect structure 56, testing pads 58, a dielectric layer 60, bonding pads 62, and conductive vias 64.

The substrate 52 may include a bulk semiconductor substrate, semiconductor-on-insulator (SOI) substrate, multi-layered semiconductor substrate, or the like. The semiconductor material of the substrate 52 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 52 may be doped or undoped. Devices (not shown), such as transistors, capacitors, resistors, diodes, and the like, may be formed in and/or on an active surface (e.g., the surface facing upward) of the substrate 52.

The conductive vias 54 are formed to extend into substrate 52 from the active surface of the substrate 52. In some embodiments, the conductive vias 54, when initially formed, do not extend to a back surface (e.g., the surface facing downward, opposite the active surface) of the substrate 52. The conductive vias 54 are also sometimes referred to as through-substrate vias or through-silicon vias (TSVs) when the substrate 52 is a silicon substrate. The conductive vias 54 may be formed by forming recesses in the substrate 52 by, for example, etching, milling, laser techniques, a combination thereof, and/or the like. A thin dielectric material may be formed in the recesses, such as by using an oxidation technique. A thin barrier layer may be conformally deposited over the active surface of the substrate 52 and in the openings, such as by CVD, ALD, PVD, thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, ALD, PVD, a combination thereof, and/or the like. Examples of conductive material are copper, tungsten, aluminum, silver, gold, a combination thereof, and/or the like. Excess of the conductive material and barrier layer is removed from the active surface of the substrate 52 by, for example, a chemical-mechanical polish (CMP). The conductive vias 54 collectively include the barrier layer and conductive material, with the barrier layer between the conductive material and the substrate 52.

An interconnect structure 56 having one or more dielectric layer(s) and respective metallization pattern(s) is formed on the active surface of the substrate 52, over the conductive vias 54. The dielectric layer(s) may be inter-metallization dielectric (IMD) layers. The IMD layers may be formed, for example, of a low-K dielectric material, such as undoped silicate glass (USG), phosphosilicate glass (PSG), borophosphosilicate glass (BPSG), fluorosilicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, chemical vapor deposition (CVD), plasma-enhanced CVD (PECVD), high-density plasma chemical vapor deposition (HDP-CVD), or the like. The metallization pattern(s) in the dielectric layer(s) may route electrical signals between the devices of the substrate 52, such as by using vias and/or traces, and may also contain various electrical devices, such as capacitors, resistors, inductors, or the like. Further, the conductive vias 54 are electrically connected to the metallization patterns. The metallization pattern(s) may be formed from a conductive material such as copper, aluminum, the like, or combinations thereof. The various devices and metallization patterns may be interconnected to perform one or more functions. The functions may include memory structures, processing structures, sensors, amplifiers, power distribution, input/output circuitry, or the like. Additionally, connectors, such as conductive pillars or contact pads, are formed in and/or on the interconnect structure 56 to provide an external electrical connection to the circuitry and devices. The above examples are provided for illustrative purposes only, and other embodiments may utilize fewer or additional elements. Other circuitry may be used as appropriate for a given application.

The testing pads 58 are a subset of the connectors formed in and/or on the interconnect structure 56. The testing pads 58 are used in subsequent steps for device testing, and are not electrically connected or active during normal operation of the integrated circuit device 50. In some embodiments, the testing pads 58 are formed of a lower-cost conductive material (e.g., aluminum) than the conductive material of the metallization pattern(s) in the interconnect structure 56.

The dielectric layer 60 covers the testing pads 58 and is over the interconnect structure 56. The dielectric layer 60 includes one or more layers of non-photo-patternable dielectric materials such as silicon nitride, silicon oxide, or the like. In some embodiments, the dielectric layer 60 is subsequently used for bonding, and may be an oxide such as silicon oxide. The dielectric layer 60 may be formed using CVD, PVD, ALD, a spin-on coating process, a combination thereof, or the like.

The bonding pads 62 are formed in the dielectric layer 60 and are physically and electrically coupled to the interconnect structure 56 by the conductive vias 64. The bonding pads 62 and conductive vias 64 comprise a conductive material, which may be a metallic material including a metal or a metal alloy such as copper, silver, gold, tungsten, cobalt, aluminum, or alloys thereof. In some embodiments, the bonding pads 62 and conductive vias 64 are formed using a dual damascene process. As an example of such a process, openings for the bonding pads 62 and conductive vias 64 may be formed in the dielectric layer 60, a thin seed layer is deposited in the openings, and the conductive material is filled in the openings using, for example, ECP or electro-less plating from the seed layer. A planarization process, such as a CMP, may be performed such that top surfaces of the bonding pads 62 and dielectric layer 60 are level. In some embodiments, the bonding pads 62 and testing pads 58 are formed from different conductive materials.

FIGS. 2A through 2L are various cross-sectional views of intermediate steps during a process for forming device packages, in accordance with some embodiments. As will be discussed in greater detail below, FIGS. 2A through 2L illustrate a process in which a device stack 102 is formed by stacking multiple first integrated circuit devices, such as the integrated circuit device 50 illustrated in FIG. 1, and in an embodiment may be memory dies. The device stack 102 is formed in a top-down (or reverse) manner, where the topmost device of the first integrated circuit devices 50 is attached face-down to a carrier, and underlying layers of the device stack 102 are subsequently attached to the topmost device. The device stack 102 is tested after formation to reduce or prevent subsequent processing of known bad die stacks.

Subsequently, the device stack 102 is attached to a second integrated circuit device 120 (see, e.g., FIG. 2I) to form a first device package 100 (see, e.g., FIG. 2I). The second integrated circuit device 120 may have a structure similar to the integrated circuit device 50, and in an embodiment may be a logic die. In an embodiment, the first device package 100 is a chip-on-wafer (CoW) package, although it should be appreciated that embodiments may be applied to other 3DIC packages. A second device package 150 (see, e.g., FIG. 2L) is then formed by mounting the first device package 100 to a substrate. In an embodiment, the second device package 150 is a chip-on-wafer-on-substrate (CoWoS) package, although it should be appreciated that embodiments may be applied to other 3DIC packages.

Figure 2A:
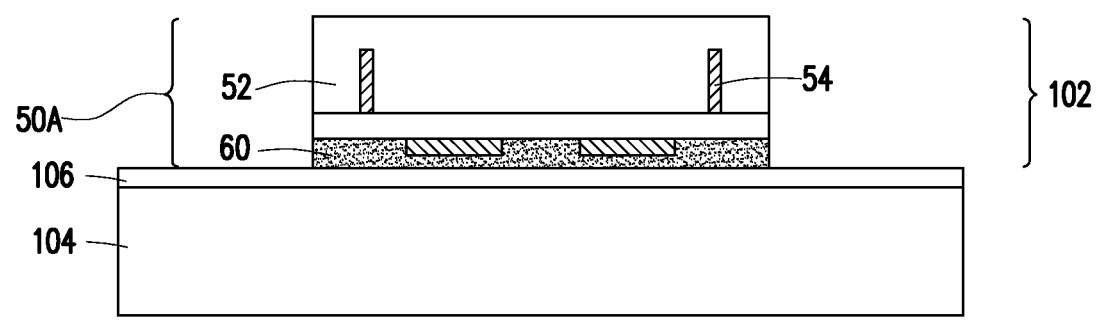
FIGS. 2A through 2L are various views of intermediate steps during a process for forming device packages, in accordance with some embodiments.

Referring now to FIG. 2A, a bonding layer 106 is deposited on a first carrier substrate 104, and a topmost integrated circuit device 50A is attached to the bonding layer 106. The first carrier substrate 104 may be a glass carrier substrate, a ceramic carrier substrate, a silicon wafer, or the like. Multiple device packages can be formed on the first carrier substrate 104 simultaneously. The bonding layer 106 is used for attaching the topmost integrated circuit device 50A to the first carrier substrate 104. In some embodiments, the first carrier substrate 104 is a silicon wafer. In such embodiments, the bonding layer 106 comprises a silicon-containing dielectric material such as silicon oxide or silicon nitride, and may be formed using CVD, PVD, spin-coating, or the like. The dielectric material may be used for bonding such as oxide-to-oxide bonding, where the dielectric layer 60 of the topmost integrated circuit device 50A is bonded to the bonding layer 106. In some embodiments, the first carrier substrate 104 is glass. In such embodiments, the bonding layer 106 comprises a release layer, such as a light-to-heat-conversion (LTHC) release coating, ultra-violet (UV) glue, or the like. The release layer may be adhesive and may be used to adhere the topmost integrated circuit device 50A to the first carrier substrate 104. The topmost integrated circuit device 50A may be tested before it is attached, such that only known good dies are used to form the device stack 102.

The topmost integrated circuit device 50A may be similar to the integrated circuit device 50 discussed above with reference to FIG. 2A, except bonding pads 62 and conductive vias 64 may not be formed before adhesion to the first carrier substrate 104. As will be discussed further below, the device stack 102 is tested after formation. Because the topmost integrated circuit device 50A is at the topmost layer of the device stack 102, the testing pads 58 of the topmost integrated circuit device 50A will be used for device testing. The bonding pads 62 and conductive vias 64 of the topmost integrated circuit device 50A may be formed after testing, to prevent damage to the bonding pads 62 during testing.

Figure 2B:
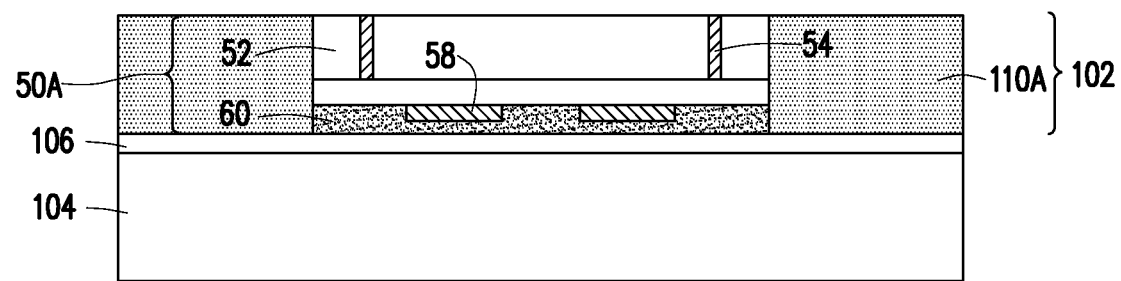

In FIG. 2B, a topmost encapsulant 110A is formed around the topmost integrated circuit device 50A and over the first carrier substrate 104. The topmost encapsulant 110A may be a molding compound, epoxy, or the like, and may be applied by compression molding, transfer molding, or the like. The topmost encapsulant 110A may be formed over the topmost integrated circuit device 50A and first carrier substrate 104 such that they are buried or covered. The topmost encapsulant 110A is then cured. The topmost encapsulant 110A and topmost integrated circuit device 50A are thinned by, e.g., a CMP, exposing the conductive vias 54 of the topmost integrated circuit device 50A. After the thinning, surfaces of the topmost encapsulant 110A and conductive vias 54 are level with the back surface of the topmost integrated circuit device 50A.

Figure 2C:
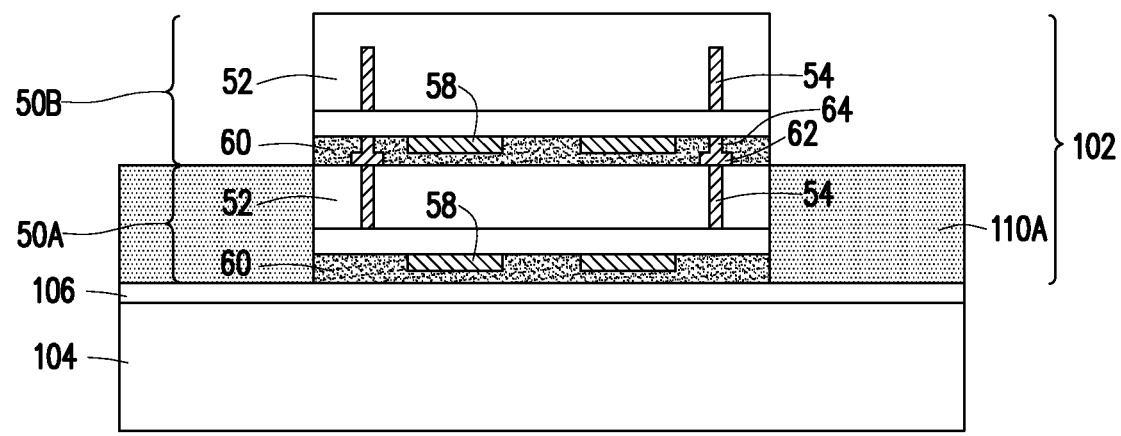

In FIG. 2C, an intermediate integrated circuit device 50B is attached to the topmost integrated circuit device 50A. In particular, the active surface of the intermediate integrated circuit device 50B is attached to the back surface of the topmost integrated circuit device 50A. Unlike the topmost integrated circuit device 50A, the intermediate integrated circuit device 50B does include the bonding pads 62 and conductive vias 64 at the time of adhesion to the topmost integrated circuit device 50A. The intermediate integrated circuit device 50B may be tested before it is attached, such that only known good dies are used to form the device stack 102.

In some embodiments, the integrated circuit devices 50A and 50B are attached by hybrid bonding. Before performing the bonding, a surface treatment may be performed on the integrated circuit devices 50A and 50B. The surface treatment may be a plasma treatment process, and the process gas used for generating the plasma may be a hydrogen-containing gas, which includes a first gas including hydrogen ($H_2$) and argon (Ar), a second gas including $H_2$ and nitrogen ($N_2$), or a third gas including $H_2$ and helium (He). Through the treatment, the number of OH groups at the surface of the dielectric layer 60 increases. Next, a pre-bonding process may be performed, where the integrated circuit devices 50A and 50B are aligned. The integrated circuit devices 50A and 50B are pressed against together to form weak bonds between the substrate 52 of the topmost integrated circuit device 50A and the dielectric layer 60 of the intermediate integrated circuit device 50B. After the pre-bonding process, the integrated circuit devices 50A and 50B are annealed to strengthen the weak bonds and form a fusion bond. During the annealing, the H of the OH bonds is outgassed, thereby forming Si—O—Si bonds between the integrated circuit devices 50A and 50B, thereby strengthening the bonds. During the hybrid bonding, direct metal-to-metal bonding also occurs between the conductive vias 54 of the topmost integrated circuit device 50A and the bonding pads 62 of the intermediate integrated circuit device 50B. Accordingly, the resulting bond is a hybrid bond that includes the Si—O—Si bond and metal-to-metal direct bond.

Figure 2D:
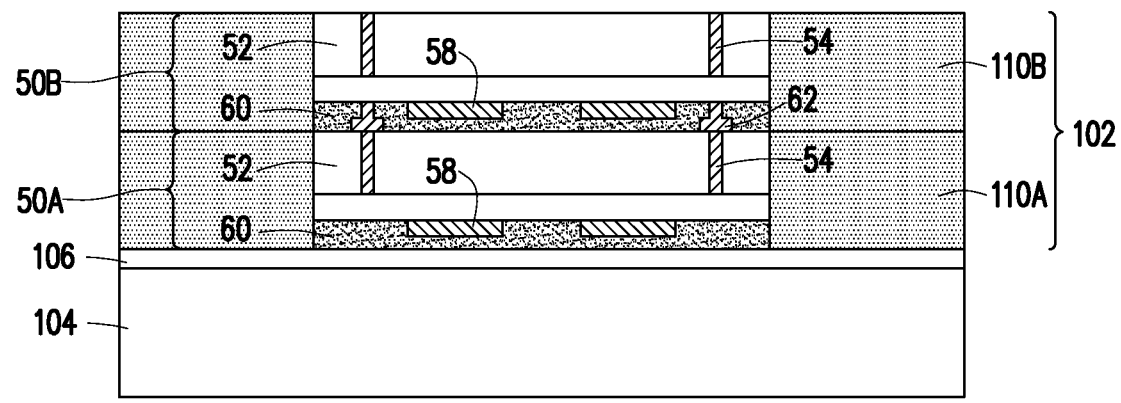

In FIG. 2D, an intermediate encapsulant 110B is formed around the intermediate integrated circuit device 50B and over the first carrier substrate 104. The intermediate encapsulant 110B may be formed from a material selected from the candidate materials of the topmost encapsulant 110A, or may include a different material. The intermediate encapsulant 110B may be formed by a method selected from the candidate methods of forming the topmost encapsulant 110A, or may be formed by a different method.

Figure 2E:
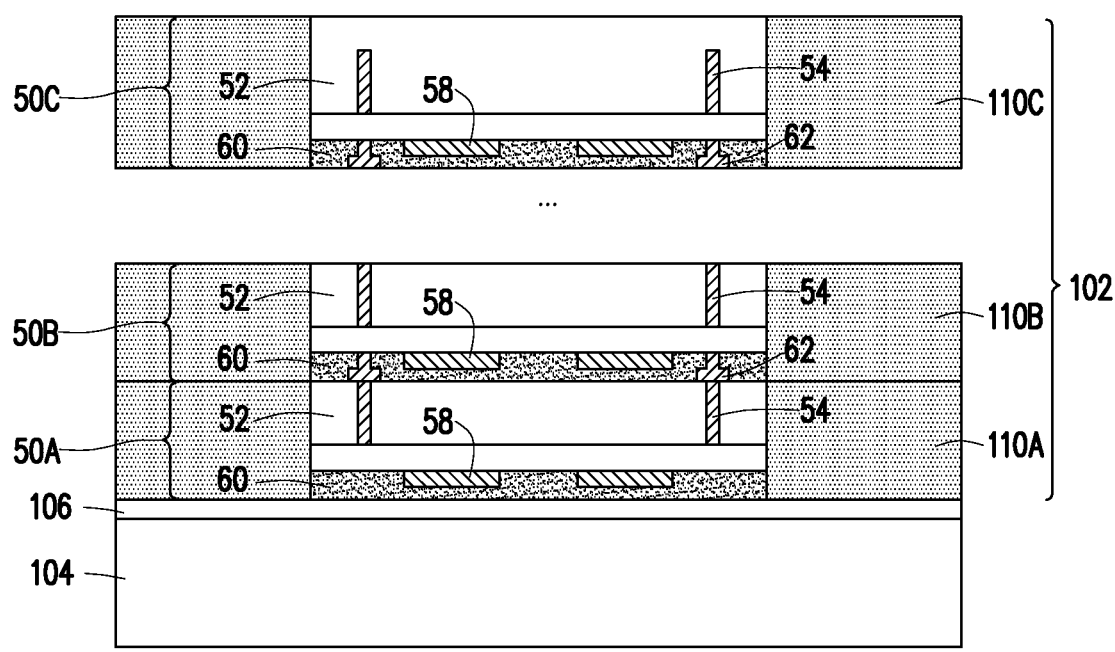

In FIG. 2E, the steps described above are repeated until the device stack 102 includes a bottommost integrated circuit device 50C surrounded by a bottommost encapsulant 110C. The bottommost integrated circuit device 50C may not be thinned, such that the conductive vias 54 of the bottommost integrated circuit device 50C remain electrically insulated. The bottommost integrated circuit device 50C may be tested before it is attached, such that only known good dies are used to form the device stack 102.

It should be appreciated that the device stack 102 may include any number of layers. In the embodiment shown, the device stack 102 includes three layers. In another embodiment, the device stack 102 includes two or more than three layers.

Figure 2F:
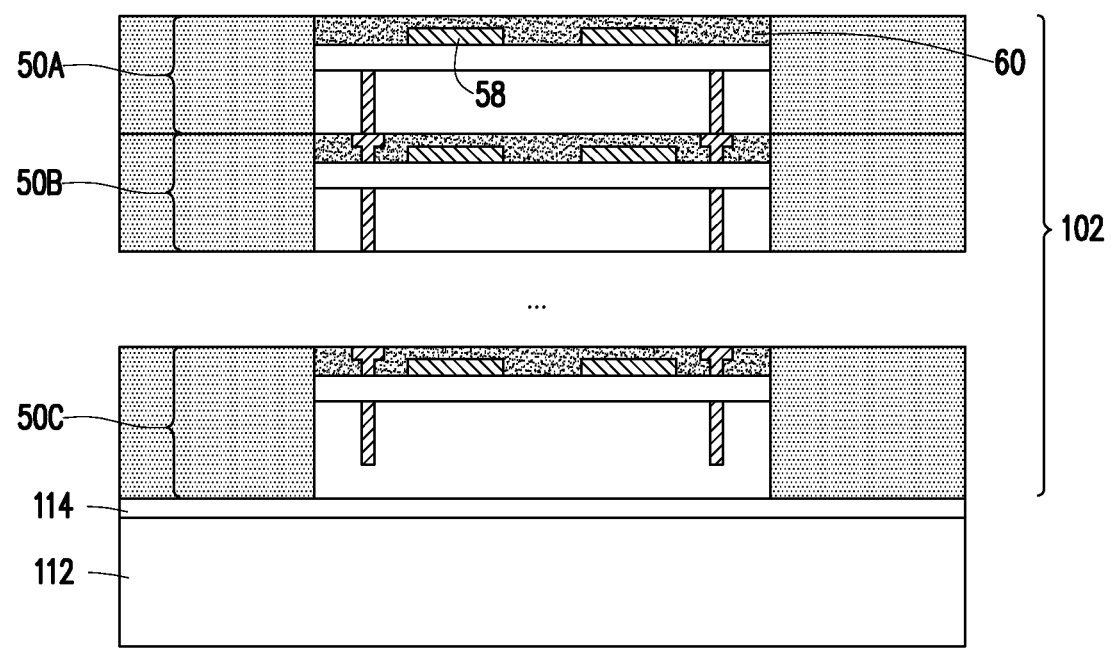

In FIG. 2F, the device stack 102 is removed from the first carrier substrate 104, flipped, and attached to a second carrier substrate 112. In embodiments where the first carrier substrate 104 is a silicon wafer and the bonding layer 106 is a dielectric layer, the removal may be accomplished by etching or grinding away the silicon wafer and dielectric layer. In embodiments where the first carrier substrate 104 is glass and the bonding layer 106 is a release layer, the removal may be accomplished by projecting a light such as a laser light or an UV light on the release layer so that the release layer decomposes under the heat of the light and the glass is debonded. The second carrier substrate 112 may be a silicon wafer, and the device stack 102 may be attached to the second carrier substrate 112 by bonding such as oxide-to-oxide bonding using a bonding layer 114. The bonding layer 114 may be an oxide that is compatible with fusion bonding, such as silicon oxide. The bonding layer 114 may be applied to a back-side of the device stack 102, such as to a back-side of the bottommost integrated circuit device 50C, or may be applied over the surface of the second carrier substrate 112, such as by CVD or the like.

Figure 2G:
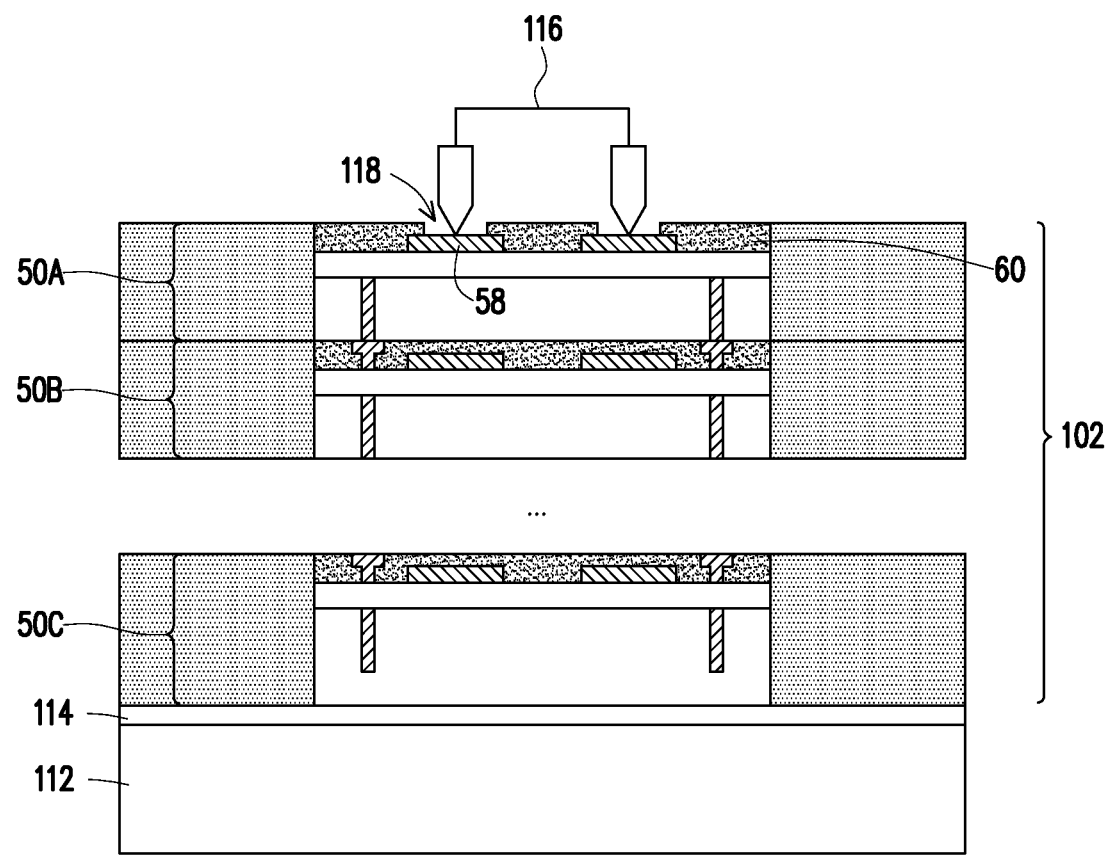

In FIG. 2G, the device stack 102 is tested by use of a probe 116. The testing pads 58 of the topmost integrated circuit device 50A are exposed by patterning the dielectric layer 60 of the topmost integrated circuit device 50A to form openings 118. The dielectric layer 60 may be patterned using suitable photolithography and etching methods. In some embodiments, a photoresist material (not shown) is formed over the dielectric layer 60. The photoresist material is subsequently irradiated (exposed) and developed to remove a portion of the photoresist material. Subsequently, exposed portions of the dielectric layer 60 are removed using, for example, a suitable etching process to form the openings 118. The probe 116 is then physically and electrically connected to the testing pads 58 exposed by the openings 118. The testing pads 58 are used to test the device stack 102, such that only known good device stacks are used for further processing. The testing may include testing of the functionality of the various integrated circuit devices, or may include testing for known open or short circuits that may be expected based on the design of the integrated circuit devices. During the testing, all integrated circuit devices of the device stack 102 may be tested in a daisy-chain manner.

Figure 2H:
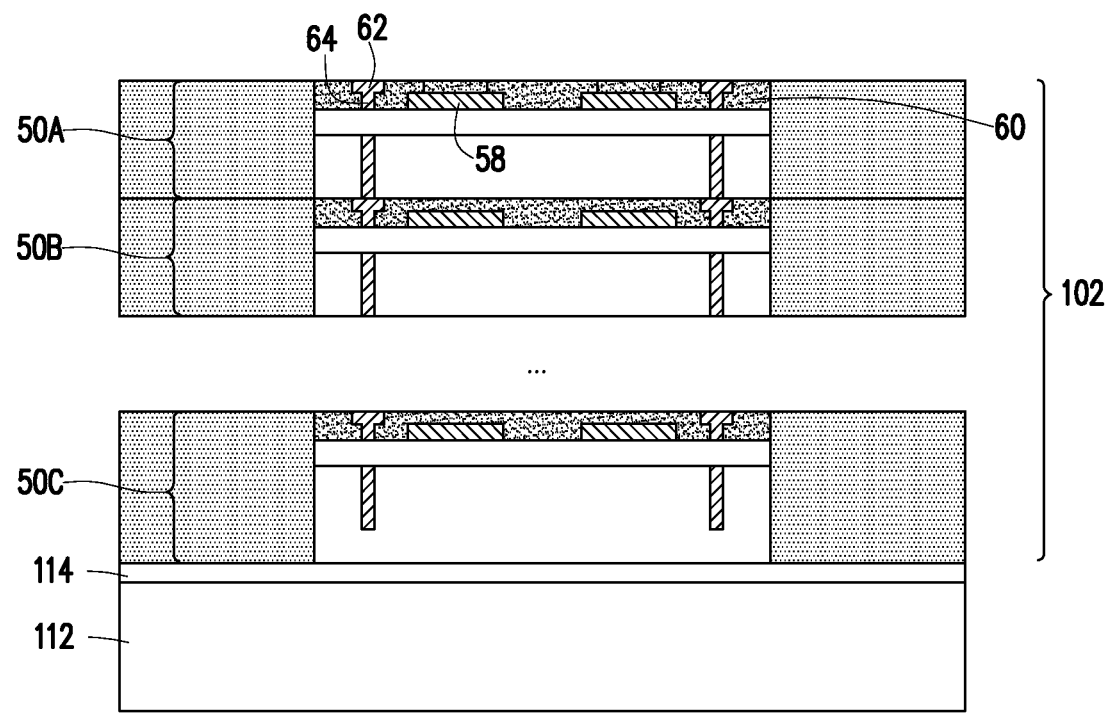

In FIG. 2H, the probe 116 is removed and the openings 118 are filled. The openings 118 may be filled by forming (e.g., depositing) more dielectric material of the dielectric layer 60 in the openings 118, and performing a planarization such as a CMP to remove excess dielectric material outside of the openings 118. The bonding pads 62 and conductive vias 64 are then formed in the dielectric layer 60 of the topmost integrated circuit device 50A using the techniques described above. Notably, the bonding pads 62 are different from the testing pads 58. The testing pads 58 may remain unused in the topmost integrated circuit device 50A after testing is complete.

Figure 2I:
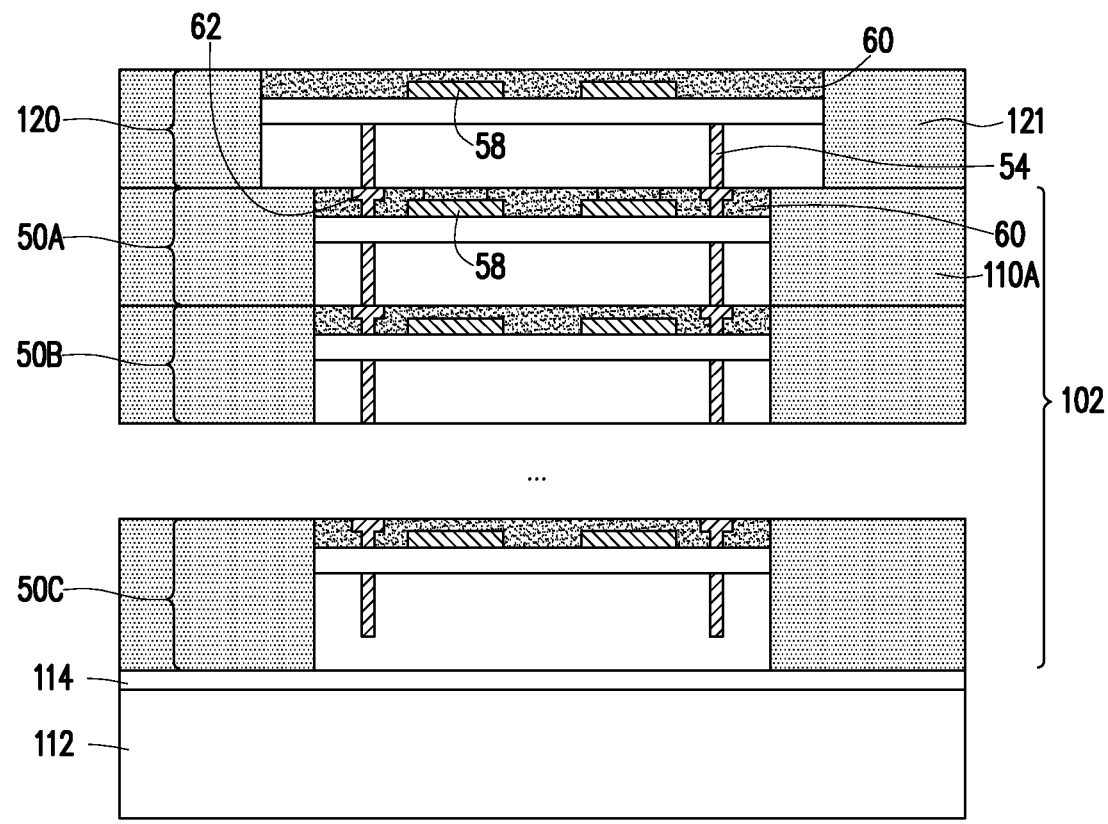

In FIG. 2I, a second integrated circuit device 120 is attached to the device stack 102, thereby forming the first device package 100. The second integrated circuit device 120 may perform a different function than the integrated circuit devices 50A, 50B, and 50C. For example, the integrated circuit devices 50A, 50B, and 50C may be memory devices, and the second integrated circuit device 120 may be a logic device (e.g., a central processing unit (CPU), graphics processing unit (GPU), system-on-a-chip (SoC), microcontroller, etc.). The second integrated circuit device 120 may be attached to the topmost integrated circuit device 50A by hybrid bonding, using the dielectric layer 60 and bonding pads 62 of the topmost integrated circuit device 50A. An encapsulant 121 is formed around the second integrated circuit device 120 and over the device stack 102. The encapsulant 121 may be formed from a material selected from the candidate materials of the topmost encapsulant 110A, or may include a different material. The encapsulant 121 may be formed by a method selected from the candidate methods for forming the topmost encapsulant 110A, or may be formed by a different method.

Figure 2J:
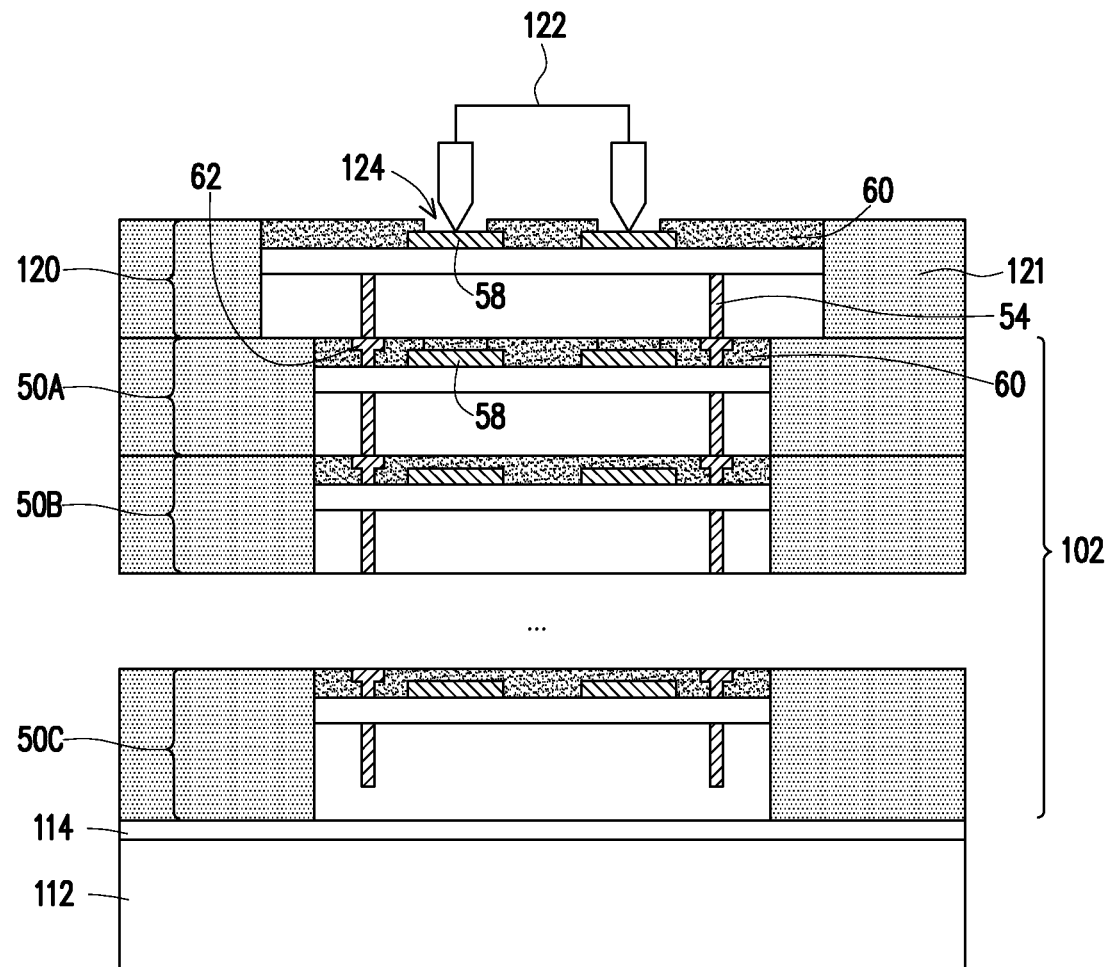

In FIG. 2J, the first device package 100 is tested by use of a probe 122. The first device package 100 is tested using the testing pads 58 of the second integrated circuit device 120. Openings 124 may be formed exposing the testing pads 58 of the second integrated circuit device 120, and the second integrated circuit device 120 may be tested using a similar method as the method for testing the device stack 102. The testing may include testing of the functionality of the integrated circuit devices of the first device package 100, or may include testing for known open or short circuits that may be expected based on the design of the integrated circuit devices.

Figure 2K:
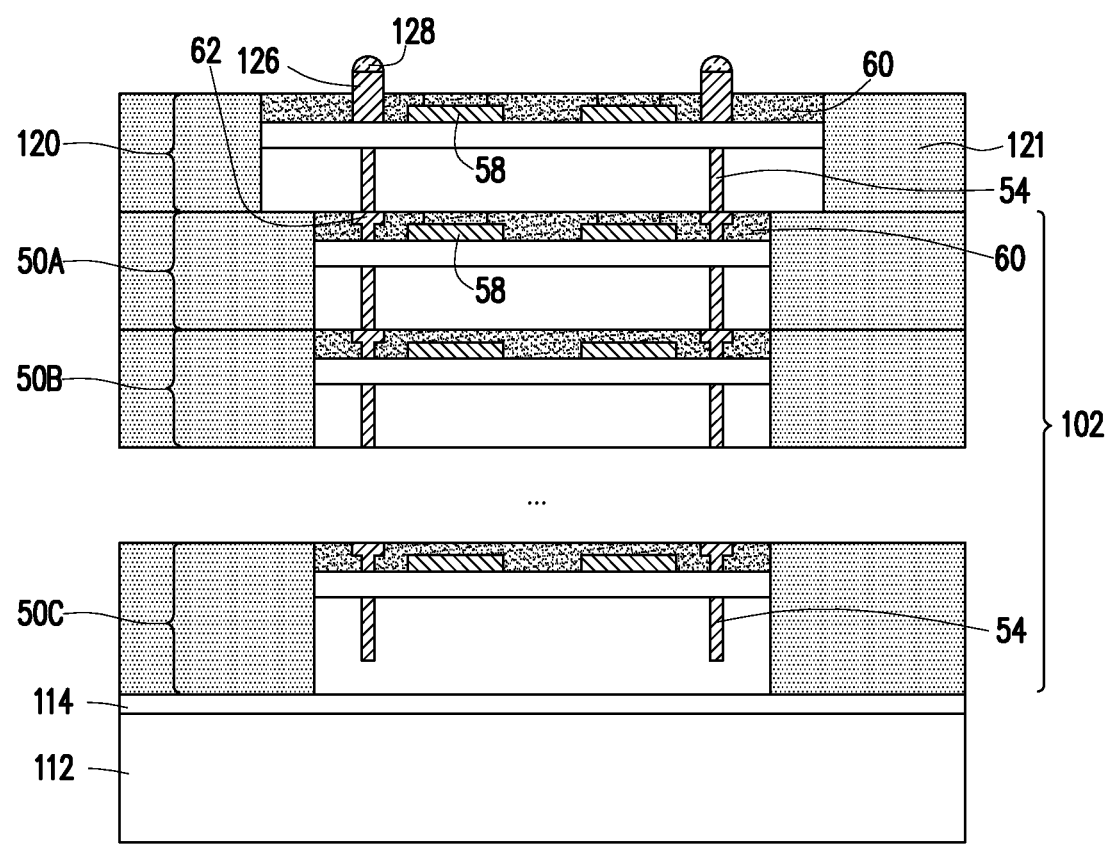

In FIG. 2K, the probe 122 is removed and the openings 124 are filled. The openings 124 may be filled using a similar method as the method for filling the openings 118. Bumps 126 are then formed on the second integrated circuit device 120, and conductive connectors 128 are formed on the bumps 126.

The bumps 126 may be metal pillars, controlled collapse chip connection (C4) bumps, micro bumps, electroless nickel-electroless palladium-immersion gold technique (ENEPIG) formed bumps, ball grid array (BGA) bumps, or the like. In an embodiment, the bumps 126 are C4 bumps. The bumps 126 may be formed by a sputtering, printing, electro plating, electroless plating, CVD, or the like. The bumps 126 may be solder free and have substantially vertical sidewalls. In some embodiments, a metal cap layer (not shown) is formed on the top of the bumps 126. The metal cap layer may include nickel, tin, tin-lead, gold, silver, palladium, indium, nickel-palladium-gold, nickel-gold, the like, or a combination thereof and may be formed by a plating process.

The conductive connectors 128 may be formed from a conductive material such as solder, copper, aluminum, gold, nickel, silver, palladium, tin, the like, or a combination thereof. In some embodiments, the conductive connectors 128 are formed by initially forming a layer of solder through methods such as evaporation, electroplating, printing, solder transfer, ball placement, or the like. Once a layer of solder has been formed on the structure, a reflow may be performed in order to shape the conductive connectors 128 into desired bump shapes. In some embodiments, the bumps 126 and conductive connectors 128 may both be solder.

Once formation of the first device package 100 is complete, the first device package 100 is singulated from adjacent device packages formed on the same carrier wafer. The singulation may be by, e.g., a sawing or laser cutting. The second carrier substrate 112 remains after singulation in some embodiments. As discussed further below, the second carrier substrate 112 may help with thermal dissipation of the first device package 100. In some embodiments, the second carrier substrate 112 may be removed, and optionally, other structures, such as cooling system, may be attached. In the embodiment shown, the conductive vias 54 of the bottommost integrated circuit device 50C are electrically isolated in the first device package 100. Such conductive vias 54 may be unused so that a same die may be used for stacking in the device stack 102.

Figure 2L:
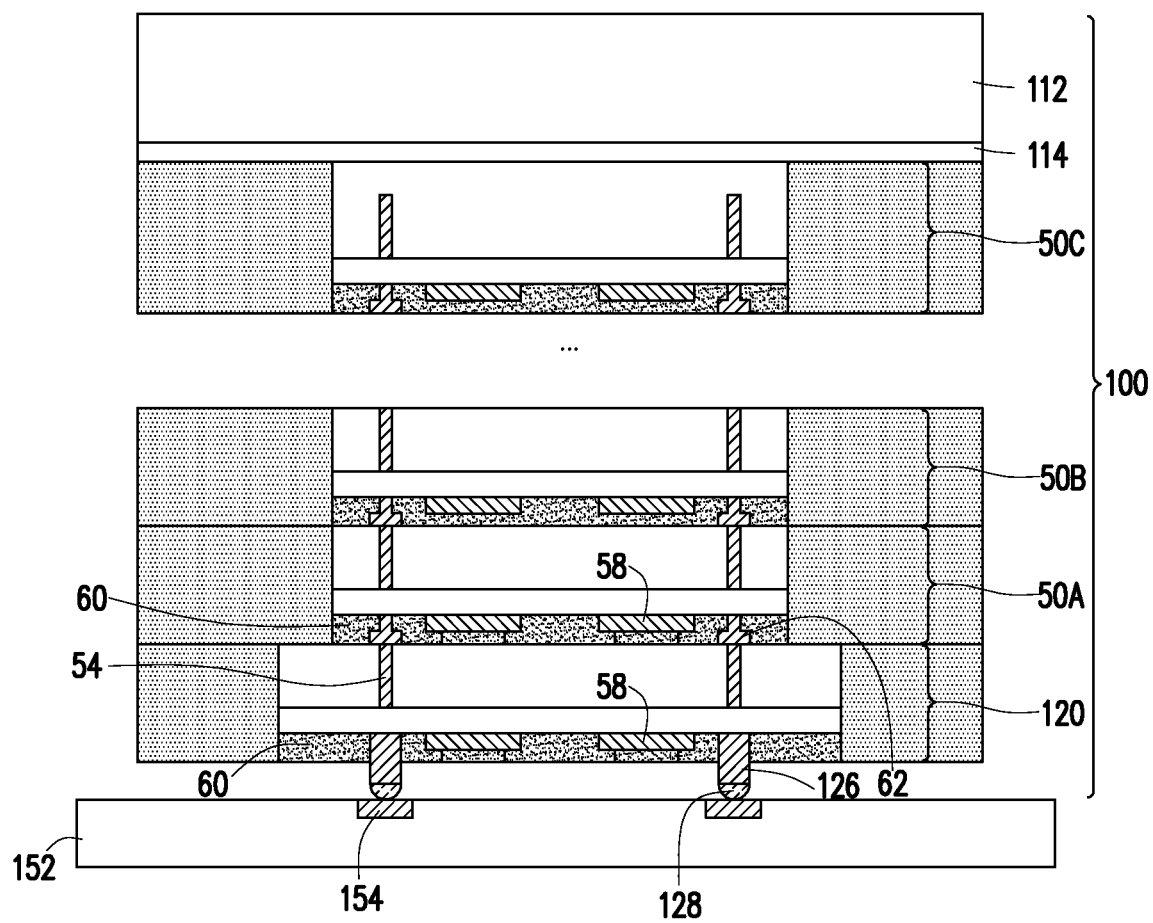

In FIG. 2L, the second device package 150 is formed by mounting the first device package 100 to a package substrate 152. The package substrate 152 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 152 may be a SOI substrate. Generally, an SOI substrate includes a layer of a semiconductor material such as epitaxial silicon, germanium, silicon germanium, SOI, SGOI, or combinations thereof. The package substrate 152 is, in one alternative embodiment, based on an insulating core such as a fiberglass reinforced resin core. One example core material is fiberglass resin such as $FR_4$. Alternatives for the core material include bismaleimide-triazine BT resin, or alternatively, other PCB materials or films. Build up films such as ABF or other laminates may be used for package substrate 152.

The package substrate 152 may include active and passive devices (not shown). A wide variety of devices such as transistors, capacitors, resistors, combinations of these, and the like, may be used to generate the structural and functional requirements of the design for the second device package 150. The devices may be formed using any suitable methods.

The package substrate 152 may also include metallization layers and vias (not shown) and bond pads 154 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 152 is substantially free of active and passive devices.

In some embodiments, the conductive connectors 128 are reflowed to attach the first device package 100 to the bond pads 154, thereby bonding the second integrated circuit device 120 to the package substrate 152. The conductive connectors 128 electrically and/or physically couple the package substrate 152, including metallization layers in the package substrate 152, to the first device package 100. In some embodiments, passive devices (e.g., surface mount devices (SMDs), not illustrated) may be attached to the second device package 150 (e.g., bonded to the bond pads 154) prior to mounting on the package substrate 152. In such embodiments, the passive devices may be bonded to a same surface of the second device package 150 as the conductive connectors 128.

The conductive connectors 128 may have an epoxy flux (not shown) formed thereon before they are reflowed with at least some of the epoxy portion of the epoxy flux remaining after the second device package 150 is attached to the package substrate 152. This remaining epoxy portion may act as an underfill to reduce stress and protect the joints resulting from the reflowing the conductive connectors 128.

An underfill (not shown) may be formed between the second integrated circuit device 120 and the package substrate 152, surrounding the conductive connectors 128. The underfill may be formed by a capillary flow process after the first device package 100 is attached or may be formed by a suitable deposition method before the first device package 100 is attached.

Figure 3:
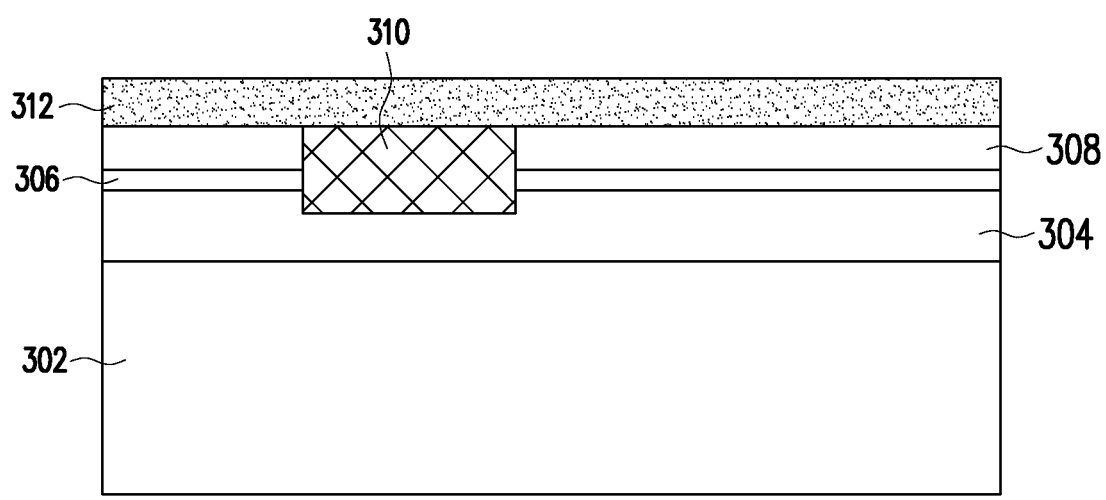
FIG. 3 is a cross-sectional view of a dummy device, in accordance with some embodiments.
Figure 4A:
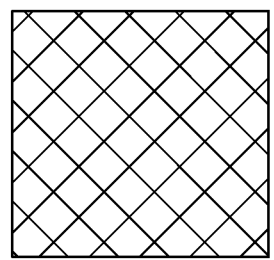
FIG. 4A through 4D are plan views of alignment marks, in accordance with various embodiments.
Figure 4B:
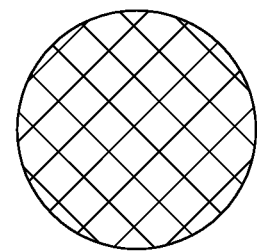
Figure 4C:
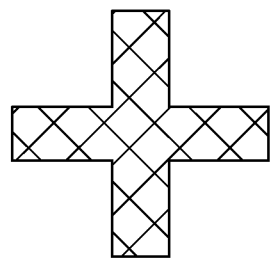
Figure 4D:
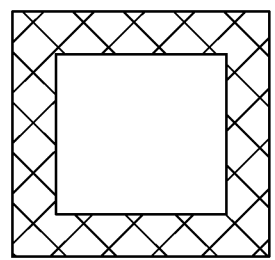

FIG. 3 is a cross-sectional view of a dummy device 300, in accordance with some embodiments. The dummy device 300 does not perform an electrical function, and has no active or passive devices formed therein. Rather, as will be discussed further below (e.g., with respect to the embodiment of FIGS. 5A through 5J and the embodiment of FIGS. 9A through 9H), the dummy device 300 may be included with embodiment device packages (e.g., the device packages 550 and 950, see below) to improve the thermal dissipation of the resulting packages. The dummy device 300 includes a substrate 302, an isolation film 304, an etch stop layer 306, an inter-metal dielectric (IMD) layer 308, an alignment mark 310, and a bonding film 312.

The isolation film 304 is formed on the substrate 302. The substrate 302 may be formed from a material selected from the candidate materials of the substrate 52, or may include a different material. The substrate 302 may be formed by a method selected from the candidate methods of forming the substrate 52, or may be formed by a different method. The isolation film 304 helps electrically isolate the alignment mark 310. The isolation film 304 may be formed from a dielectric material such as silicon carbide, silicon nitride, or the like, and may be formed by CVD, PVD, or the like. In an embodiment, the isolation film 304 is formed to a thickness of less than about 5 kÅ.

The etch stop layer 306 is formed on the isolation film 304. The etch stop layer 306 may be formed from silicon carbide, silicon nitride, silicon oxynitride, silicon carbonitride, or the like. The etch stop layer 306 may be formed by chemical vapor deposition (CVD), physical vapor deposition (PVD), atomic layer deposition (ALD), a spin-on-dielectric process, the like, or a combination thereof. In an embodiment, the etch stop layer 306 is formed to a thickness of from about 500 Å to about 2 kÅ.

The IMD layer 308 is formed over the etch stop layer 306. The IMD layer 308 may be a layer formed from a low-k dielectric material having a k-value lower than about 3.0. The IMD layer 308 may be from an extra-low-k (ELK) dielectric material having a k-value of less than 2.5. In some embodiments, the IMD layer 308 may be formed from Black Diamond (a registered trademark of Applied Materials), an oxygen-containing and/or carbon containing low-k dielectric material, Hydrogen SilsesQuioxane (HSQ), MethylSilsesQuioxane (MSQ), or the like. The IMD layer 308 may be a porous material. The IMD layer 308 may also be from a dielectric material such as silicon nitride, silicon oxide, or the like. In an embodiment, the IMD layer 308 is formed to a thickness of from about 2 kÅ to about 8 kÅ. In some embodiments, the materials of the etch stop layer 306 and the IMD layer 308 are selected to achieve a high etching selectivity between the etch stop layer 306 and the IMD layer 308, and hence the etch stop layer 306 may be used to stop the etching of the IMD layer 308 in subsequent processing steps.

The alignment mark 310 is formed in the IMD layer 308, and may extend through the etch stop layer 306 and isolation film 304. The alignment mark 310 may be formed using a single damascene process. As an example to form the alignment mark 310, an opening (not shown) may be formed in the IMD layer 308 by an etching process. The etching process may remove material of the IMD layer 308 and may not remove material of the etch stop layer 306. Once the etch stop layer 306 is exposed, a different etching process may be performed to extend the opening through the etch stop layer 306. The opening may also be extended at least partially into the isolation film 304. One or more diffusion barrier layers (not shown) is optionally formed in the opening, and a conductive material is then formed over the diffusion barrier layers, if present. The diffusion barrier layers may be formed from TaN, Ta, TiN, Ti, CoW, or the like, and may be formed in the openings by a deposition process such as ALD or the like. The conductive material may include copper, aluminum, tungsten, silver, and combinations thereof, or the like, and may be formed over the diffusion barrier layers in the openings by an electro-chemical plating process, CVD, ALD, PVD, the like, or a combination thereof. In an embodiment, the conductive material is copper, and the diffusion barrier layers are thin barrier layers that prevent the copper from diffusing into the IMD layer 308. After formation of the diffusion barrier layers and the conductive material, excess of the diffusion barrier layers and conductive material may be removed by, for example, a planarization process such as a CMP.

The bonding film 312 is formed on the alignment mark 310 and IMD layer 308. The bonding film 312 is used for bonding such as oxide-to-oxide bonding in subsequent steps, and is formed from a material that may be used to form oxide-to-oxide bonds with a semiconductor substrate. In an embodiment, the bonding film 312 is formed from an oxide such as silicon oxide, and may be formed using CVD, PVD, ALD, a spin-on coating process, a combination thereof, or the like. In an embodiment, the bonding film 312 is formed to a thickness of from about 0.8 µm to about 2 µm.

FIGS. 4A through 4D are plan views of the alignment mark 310, in accordance with various embodiments. As shown, the alignment mark 310 may be formed to have a variety of shapes in a plan view. For example, the alignment mark 310 may have a closed square shape (see FIG. 4A), a round shape (see FIG. 4B), a cross shape (see FIG. 4C), or an open square shape (see FIG. 4D). It should be appreciated that other shapes may also be used.

FIGS. 5A through 5J are various cross-sectional views of intermediate steps during a process for forming device packages, in accordance with some embodiments. In FIGS. 5A through 5J, a device stack 502 is formed by stacking multiple dummy devices (such as the dummy device 300 described above with reference to FIGS. 3 and 4A-4D) and first integrated circuit devices (such as the integrated circuit devices 50 described above with reference to FIG. 1). The device stack 502 is tested after formation. Subsequent device packages are then formed with the device stack 502. Forming the device stack 502 with the dummy devices 300 may help with heat dissipation of the resulting device packages. Further, the alignment marks 310 in the dummy devices 300 may improve device stacking accuracy in subsequent processing. The device packages may be CoW or CoWoS packages, although it should be appreciated that embodiments may be applied to other 3DIC packages.

Figure 5A:
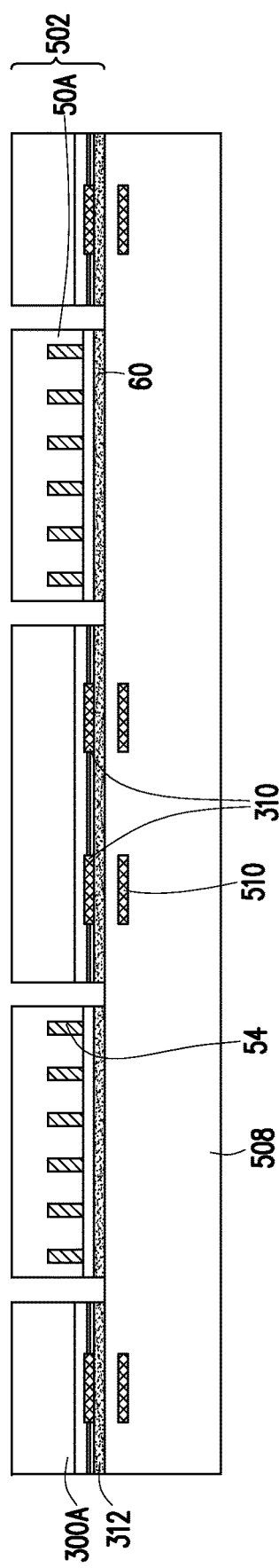
FIGS. 5A through 5J are various views of intermediate steps during a process for forming device packages, in accordance with some embodiments.

Referring first to FIG. 5A, multiple topmost integrated circuit devices 50A and dummy devices 300A are adhered to a first carrier substrate 508. In some embodiments, the topmost integrated circuit devices 50A lack bonding pads at the time of adhesion to the first carrier substrate 508. The topmost integrated circuit devices 50A may be tested before they are attached, such that only known good dies are used to form the device stack 502.

The first carrier substrate 508 may be formed from a silicon wafer or the like, and alignment marks 510 are formed in or over the silicon wafer. The alignment marks 510 may be formed in a similar manner as the alignment marks 310 of the dummy devices 300A.

The topmost integrated circuit devices 50A and dummy devices 300A are placed face-down on the first carrier substrate 508 and are adhered using bonding such as oxide-to-oxide bonding with, respectively, the dielectric layers 60 and bonding films 312. The placement may be by, e.g., a pick-and-place process. During placement, the alignment marks 310 of the dummy devices 300A are aligned with alignment marks 510 of the first carrier substrate 508, which may allow for more accurate placement during the pick-and-place process. Corners of the topmost integrated circuit devices 50A may be aligned during the pick-and-place. In some embodiments, the integrated circuit devices 50A are placed before the dummy devices 300A. In some embodiment, the dummy devices 300A are placed before the integrated circuit devices 50A. Details about how the alignment marks 310 may be used will be discussed in further detail below.

Figure 5B:
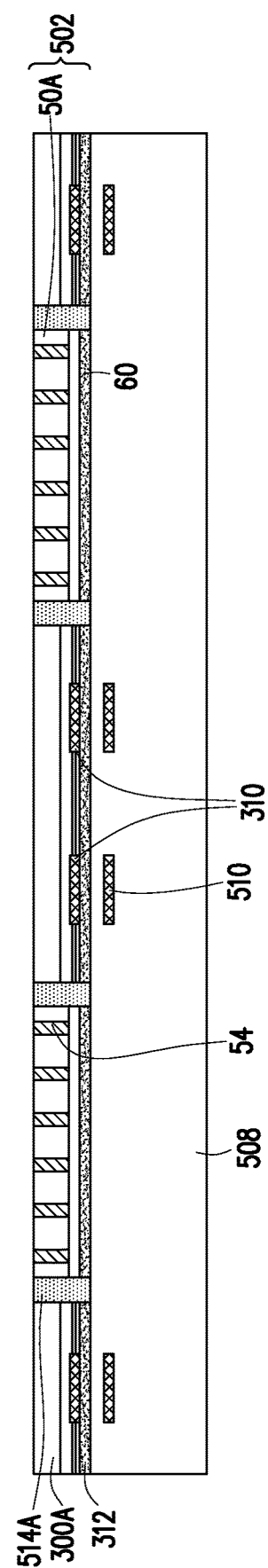

In FIG. 5B, a topmost encapsulant 514A is formed around the topmost integrated circuit devices 50A, around the dummy devices 300A, and over the first carrier substrate 508. The topmost encapsulant 514A may be formed from a material selected from the candidate materials of the topmost encapsulant 110A (see FIG. 2B), or may include a different material. The topmost encapsulant 514A may be formed by a method selected from the candidate methods of forming the topmost encapsulant 110A, or may be formed by a different method. The topmost encapsulant 514A, topmost integrated circuit devices 50A, and dummy devices 300A are thinned by, e.g., a CMP, thereby exposing the conductive vias 54 of the topmost integrated circuit devices 50A.

Figure 5C:
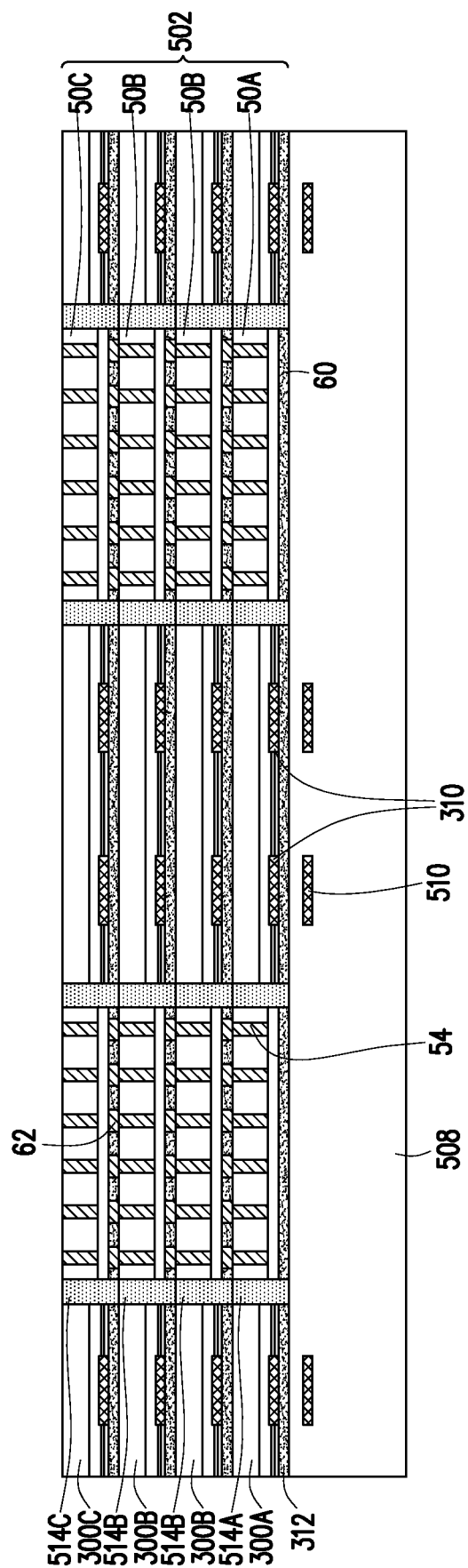

In FIG. 5C, the steps described above are repeated to form additional layers of the device stack 502. Intermediate integrated circuit devices 50B and dummy devices 300B are attached to the topmost integrated circuit devices 50A and dummy devices 300A. Likewise, bottommost integrated circuit devices 50C and dummy devices 300C are attached to the intermediate integrated circuit devices 50B and dummy devices 300B. The intermediate integrated circuit devices 50B and bottommost integrated circuit devices 50C include the bonding pads 62 at the time of adhesion. As such, the integrated circuit devices of each layer are attached to the underlying layer by hybrid bonding. Each of the integrated circuit devices may be tested before they are attached, such that only known good dies are used to form the device stack 502.

It should be appreciated that the device stack 502 may include any number of layers. In the embodiment shown, the device stack 502 includes four layers (e.g., topmost integrated circuit devices 50A and dummy devices 300A; two layers of intermediate integrated circuit devices 50B and dummy devices 300B; and bottommost integrated circuit devices 50C and dummy devices 300C). In another embodiment, the device stack 502 includes a greater or lesser number of layers, such as five layers or two layers.

Figure 5D:
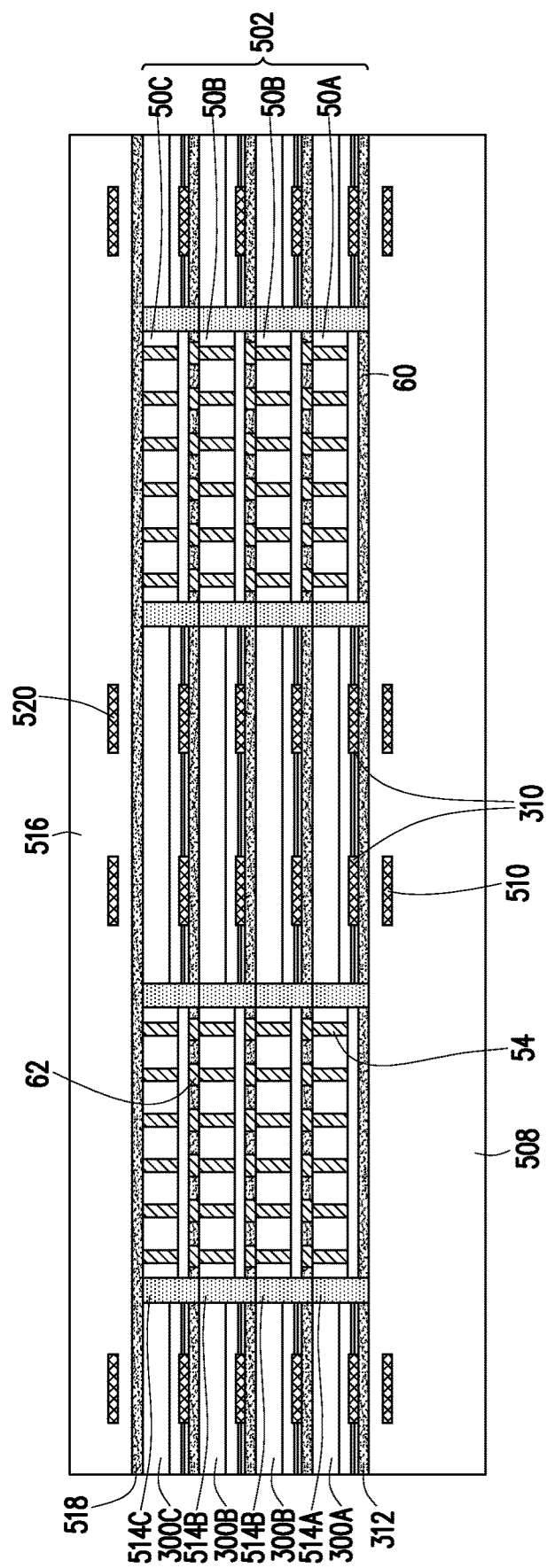

In FIG. 5D, a second carrier substrate 516 is attached to the device stack 502 by bonding such as oxide-to-oxide bonding using a bonding layer 518. The second carrier substrate 516 may be formed from a silicon wafer or the like, and alignment marks 520 are formed in or over the silicon wafer. The alignment marks 520 may be formed in a similar manner as the alignment marks 310 of the dummy devices 300A. The alignment marks 520 of the second carrier substrate 516 are aligned with alignment mark 310 of the dummy devices 300A, 300B, and 300C such that the second carrier substrate 516 may be more accurately placed. The bonding layer 518 may be formed from a material selected from the candidate materials of the bonding layer 114, or may include a different material. The bonding layer 518 may be formed by a method selected from the candidate methods of forming the bonding layer 114 (see FIG. 2F), or may be formed by a different method. In an embodiment, the bonding layer 518 is an oxide that is compatible with oxide-to-oxide bonding, such as silicon oxide.

Figure 5E:
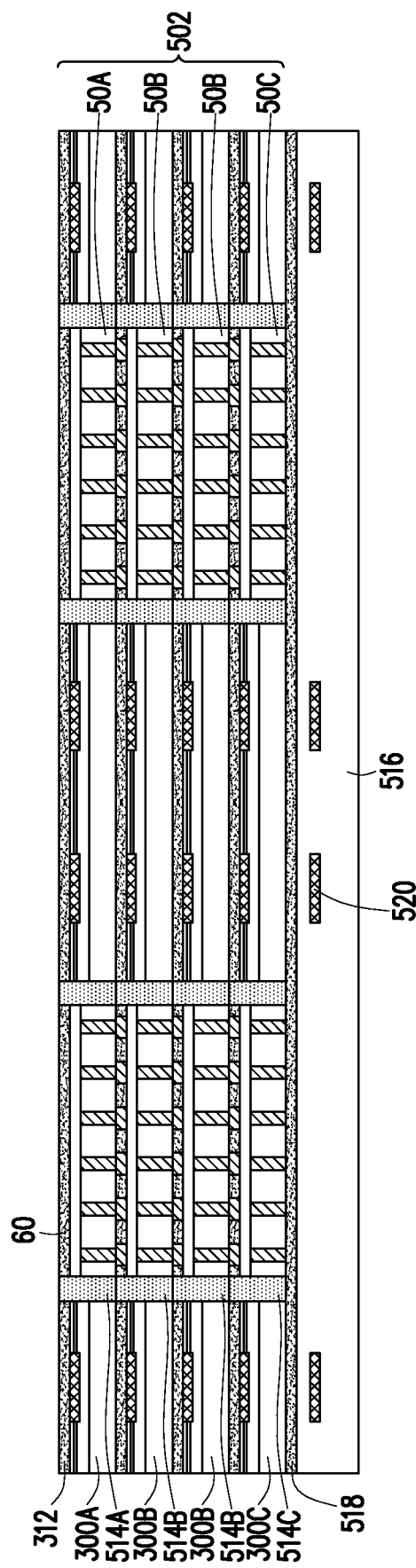

In FIG. 5E, the device stack 502 is removed from the first carrier substrate 508 and flipped. In embodiments where the first carrier substrate 508 is a silicon wafer and the bonding layer 518 is a dielectric layer, the removal may be accomplished by etching or grinding away the silicon wafer and dielectric layer. The device stack 502 may then be tested, such that only known good device stacks are used for further processing. Similar to the device stack 102, the topmost integrated circuit devices 50A may include test pads (not shown), which are used for testing. The test pads may be exposed for testing, and then covered after testing such that they are electrically isolated. The test pads may be formed from a different material than the bonding pads 62.

Figure 5F:
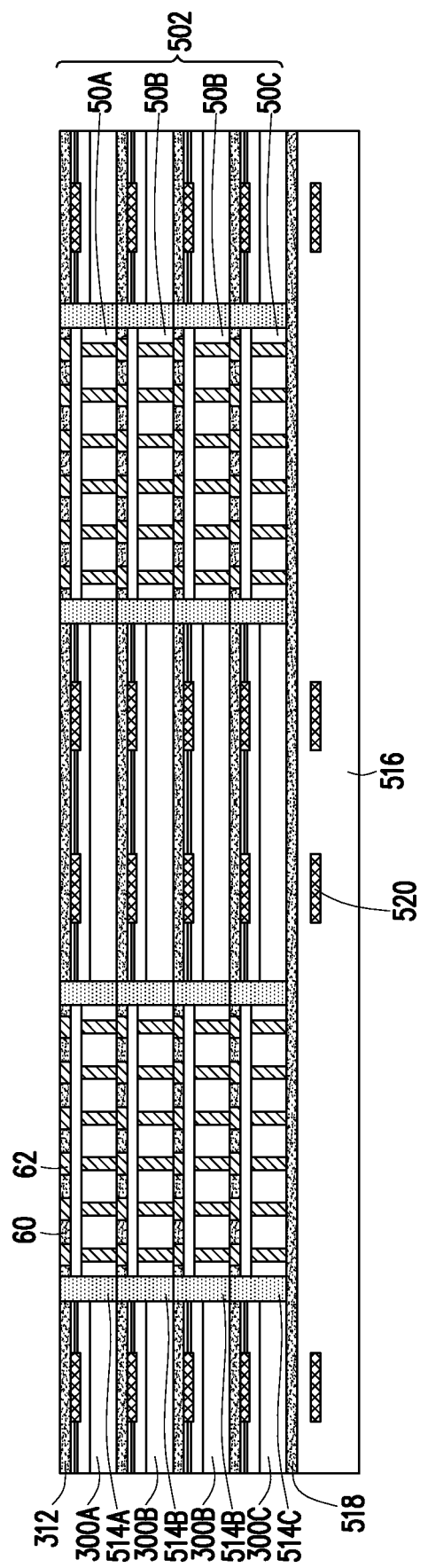

In FIG. 5F, the bonding pads 62 are formed in the dielectric layer 60 of the topmost integrated circuit devices 50A. The bonding pads 62 may be formed by a dual damascene process after testing. Notably, the bonding pads 62 are different from the testing pads 58 (not shown in FIG. 5F, but shown above in FIG. 1).

Figure 5G:
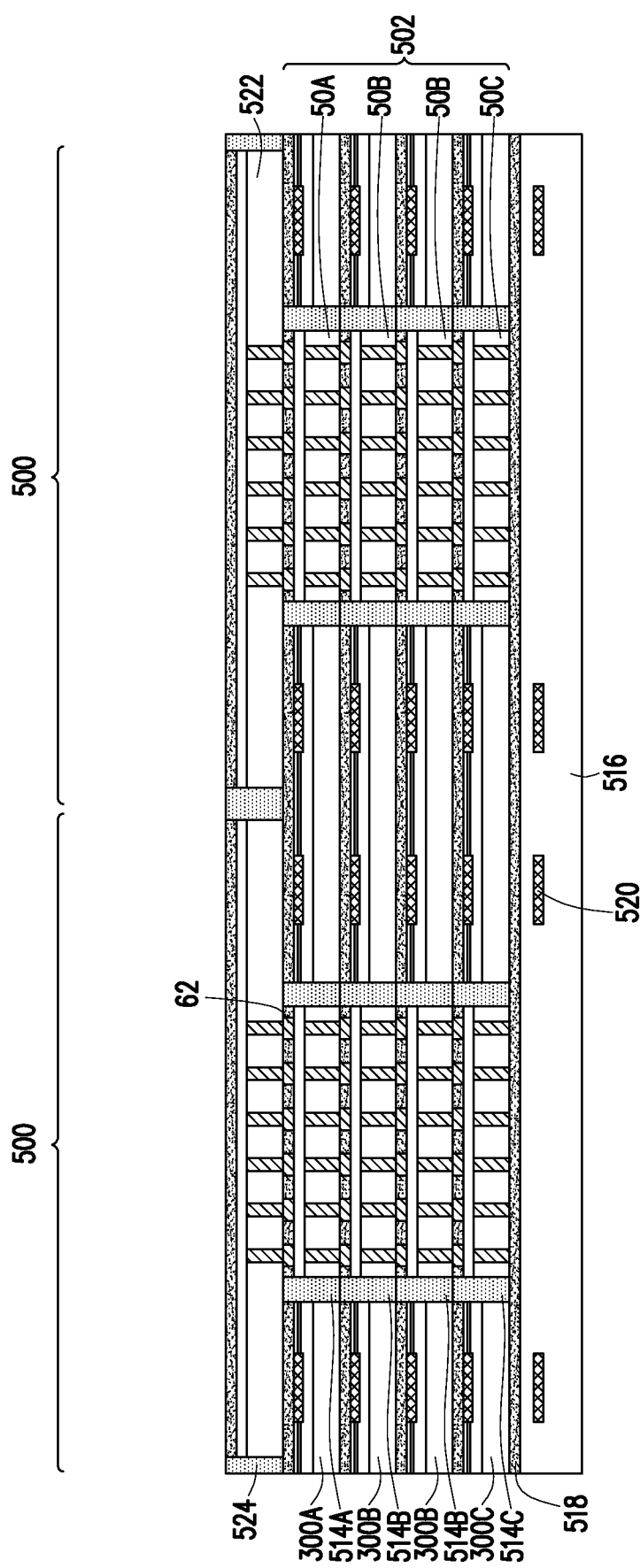

In FIG. 5G, second integrated circuit devices 522 are attached to the device stack 502 by hybrid bonding with the bonding pads 62 of the topmost integrated circuit devices 50A, thereby forming first device packages 500. The second integrated circuit device 120 may perform a different function than the integrated circuit devices 50A, 50B, and 50C. Before attachment, the second integrated circuit devices 522 may be tested, such that only known good dies are used to form the first device packages 500.

An encapsulant 524 is formed around the second integrated circuit devices 522. The encapsulant 524 may be formed from a material selected from the candidate materials of the topmost encapsulant 110A (see FIG. 2B), or may include a different material. The encapsulant 524 may be formed by a method selected from the candidate methods of forming the topmost encapsulant 110A, or may be formed by a different method. The encapsulant 524 and second integrated circuit devices 522 are thinned by, e.g., a CMP, such that they have level surfaces.

Figure 5H:
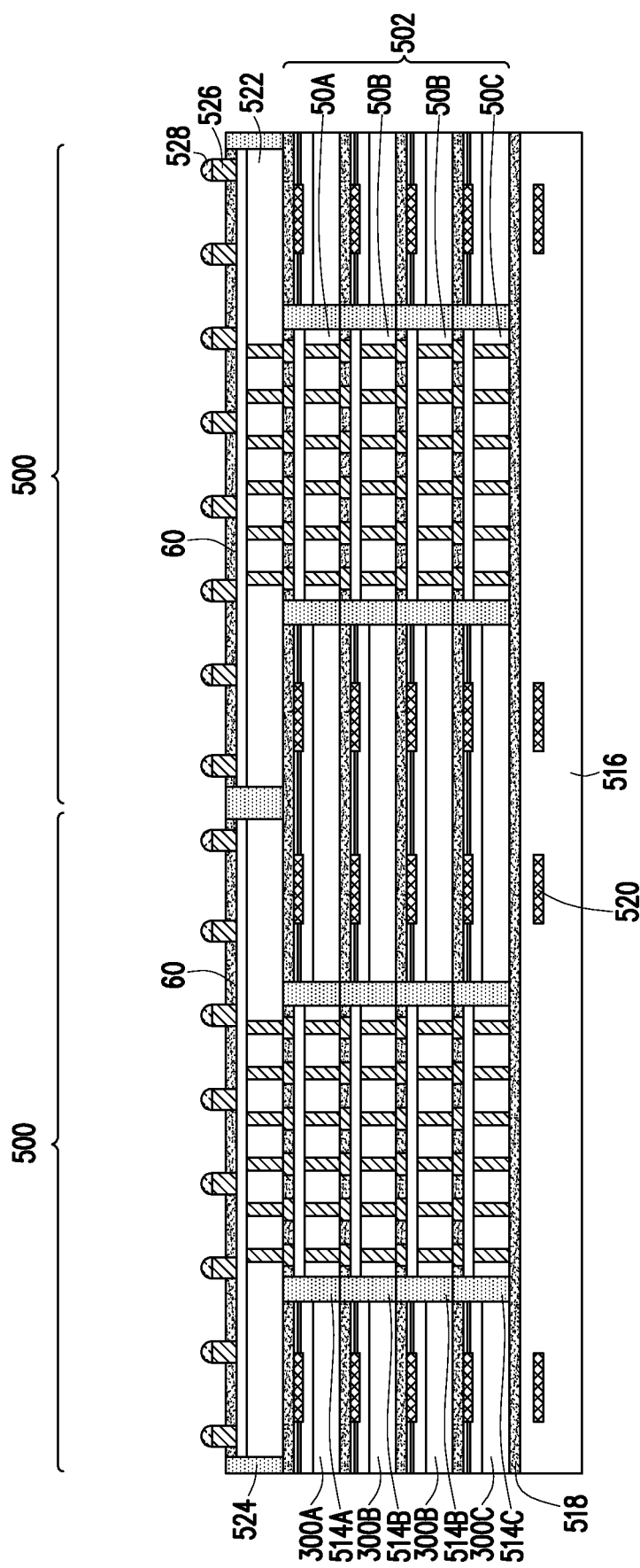

In FIG. 5H, openings are formed in the dielectric layers 60 of the second integrated circuit devices 522, and bumps 526 are formed in the openings. The bumps 526 may be formed from a material selected from the candidate materials of the bumps 126 (see FIG. 2K), or may include a different material. The bumps 526 may be formed by a method selected from the candidate methods of forming the bumps 126, or may be formed by a different method.

Conductive connectors 528 are then formed on the bumps 526. The conductive connectors 528 may be formed from a material selected from the candidate materials of the conductive connectors 128 (see FIG. 2K), or may include a different material. The conductive connectors 528 may be formed by a method selected from the candidate methods of forming the conductive connectors 128, or may be formed by a different method. The first device packages 500 may then be tested by a probe, using the conductive connectors 528, such that only known good devices are used for further processing.

Figure 5I:
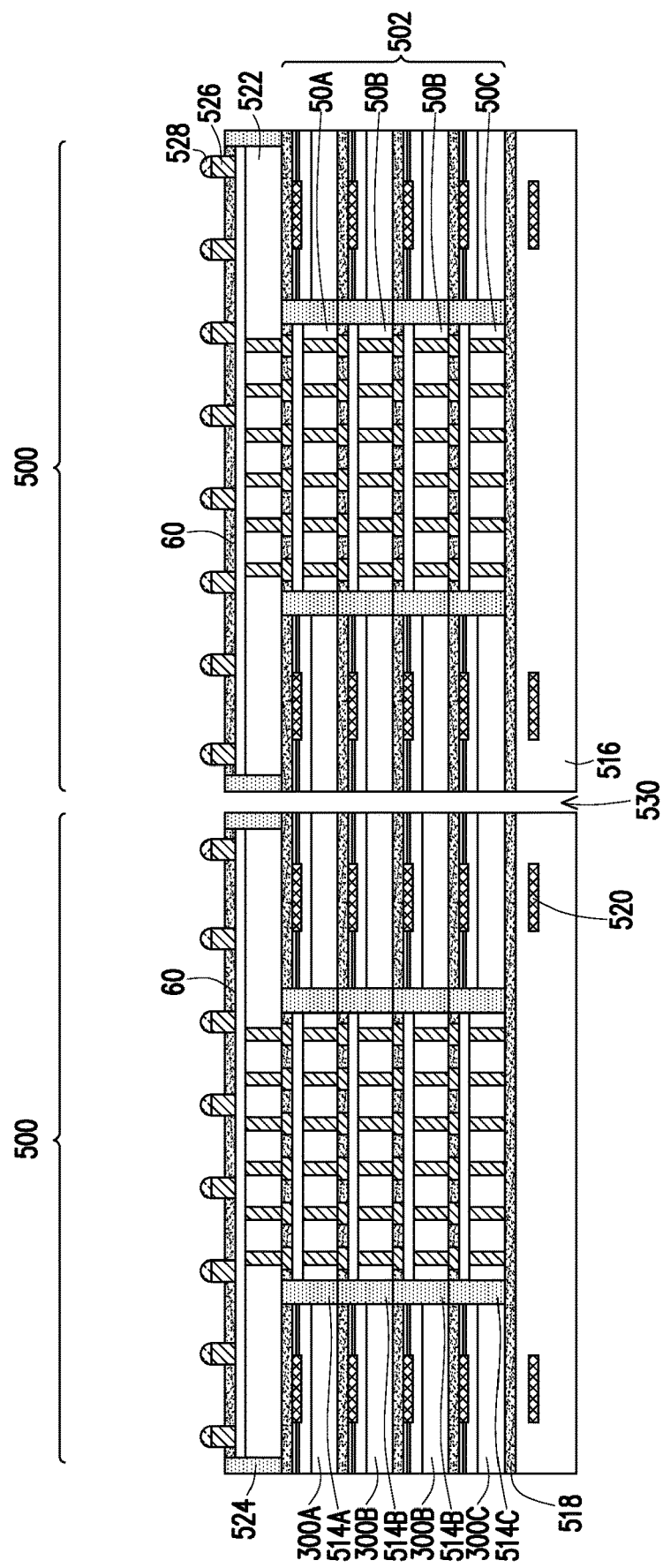

In FIG. 5I, the first device packages 500 are singulated from adjacent device packages. The singulation may be by, e.g., a sawing or laser cutting along scribe lines 530. Although it is not shown, it should be appreciated that the alignment marks 520 of the second carrier substrate 516 may be disposed along the scribe lines 530. As such, the singulation process may result in some of the alignment marks 520 being cut or removed, such that portions of the second carrier substrate 516 in the first device packages 500 have fragments or portions of the alignment marks 520.

Figure 5J:
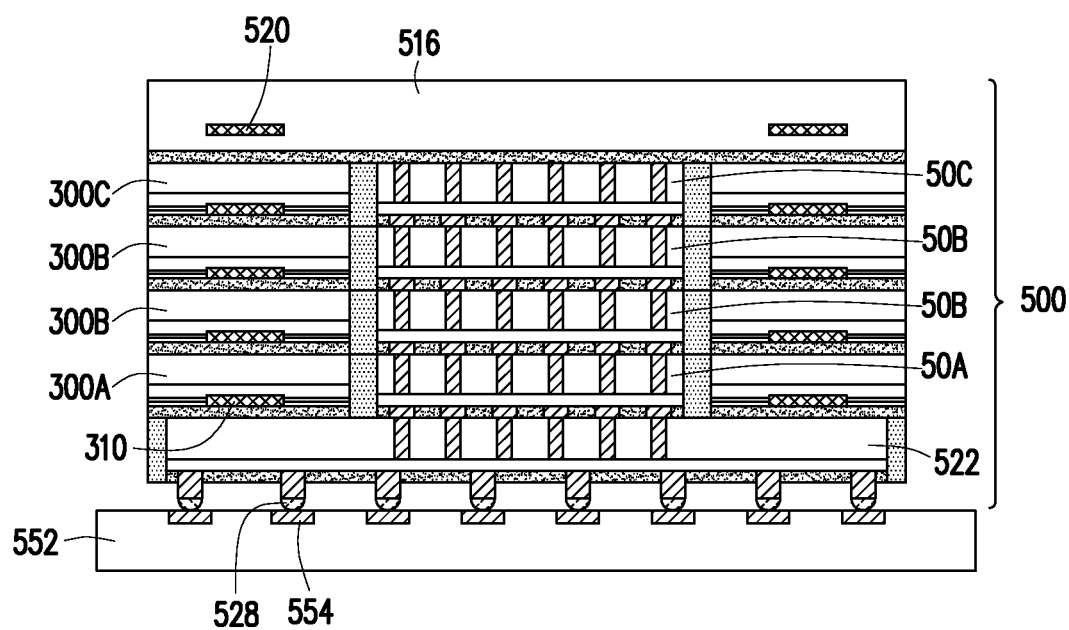

In FIG. 5J, second device packages 550 are formed by mounting the first device packages 500 to a package substrate 552. The package substrate 552 may be similar to the package substrate 152 (see FIG. 2L). The package substrate 552 may include metallization layers and vias (not shown) and bond pads 554 over the metallization layers and vias. The conductive connectors 528 of the first device packages 500 are coupled to the bond pads 554 of the package substrate 552 to form the second device packages 550.

The dummy devices 300A, 300B, and 300C may form a thermal pathway between the second integrated circuit devices 522 and the second carrier substrate 516. As such, the heat dissipation of the resulting second device packages 550 may be improved. Further, by forming the alignment marks 310 in the dummy devices 300A, 300B, and 300C, alignment marks may be omitted from the integrated circuit devices 50A, 50B, and 50C. The available routing area in the various integrated circuit devices may thus be increased.

Figure 6A:
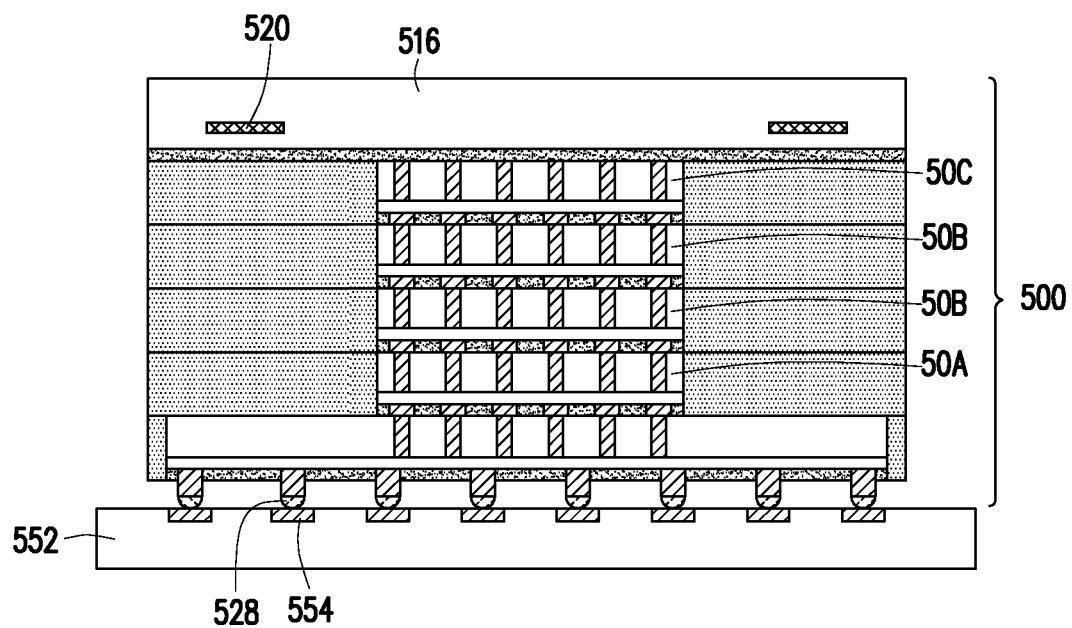
FIGS. 6A and 6B illustrate variations of the device packages, in accordance with various embodiments.
Figure 6B:
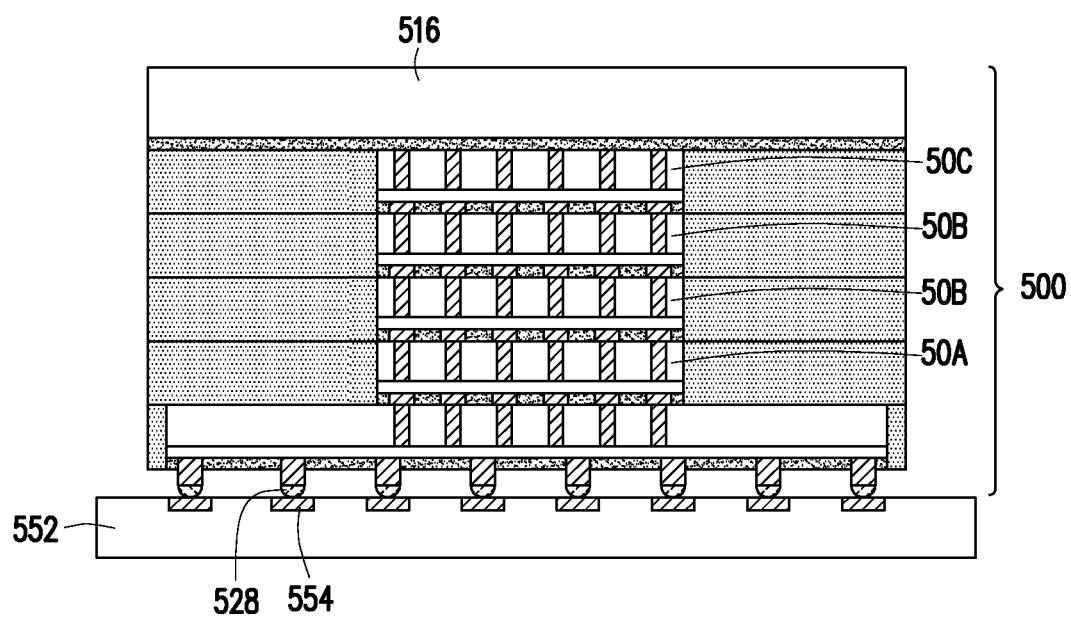

FIGS. 6A and 6B illustrate variations of the second device package 550, in accordance with various embodiments. In a first variation (e.g., FIG. 6A), the dummy devices 300 may be omitted. As such, only the second carrier substrate 516 includes alignment marks 520 in the second device packages 550. During formation, the alignment marks 520 of the second carrier substrate 516 may be aligned with the alignment marks 510 (see FIG. 5D) of the first carrier substrate 508. In a second variation (e.g., FIG. 6B), the dummy devices 300 and alignment marks 520 may be omitted. The illustrated variations may have lower manufacturing costs.

FIGS. 7A through 7C are top-down views showing the device stack 502 at different stages of manufacturing, in accordance with various embodiments. In the example shown, FIG. 7A may correspond to placement of the topmost integrated circuit devices 50A (shown in FIG. 5A), FIG. 7B may correspond to placement of the topmost dummy devices 300A (shown in FIG. 5A), and FIG. 7C may correspond to placement of the intermediate integrated circuit devices 50B and dummy devices 300B (shown in FIG. 5C). Use of the alignment marks 310 and 510 is illustrated. In FIG. 7A, a first layer of integrated circuit device 50 is placed over the first carrier substrate 508. The alignment marks 510 of the first carrier substrate 508 are disposed between the integrated circuit devices 50. In FIG. 7B, a first layer of dummy devices 300 is disposed over the first carrier substrate 508 between the integrated circuit devices 50. The alignment marks 310 of the first layer of dummy devices 300 are aligned with a first subset 510A of the alignment marks 510. In FIG. 7C, a second layer of integrated circuit device 50 and dummy devices 300 is placed on the first layer. The alignment marks 310 of the second layer of dummy devices 300 are aligned with a second subset 510B of the alignment marks 510. The material of the dummy devices 300 is transparent to the light used for aligning the alignment marks 310. Further, the first subset 510A and second subset 510B of the alignment marks 510 may have different shapes (see, e.g., FIGS. 4A through 4D). For example, the dummy devices 300 of a first layer may be aligned with underlying alignment marks 510 having a first shape, and the dummy devices 300 of a second layer may be aligned with underlying alignment marks 510 having a second shape. Further, some of the dummy devices 300 may have multiple laterally offset alignment marks 310 (see FIG. 7C), to ensure the dummy devices 300 are properly rotated during alignment. Further, the alignment marks 310 of the dummy devices 300 in different layers do not overlap in a plan or top-down view.

Figure 8A:
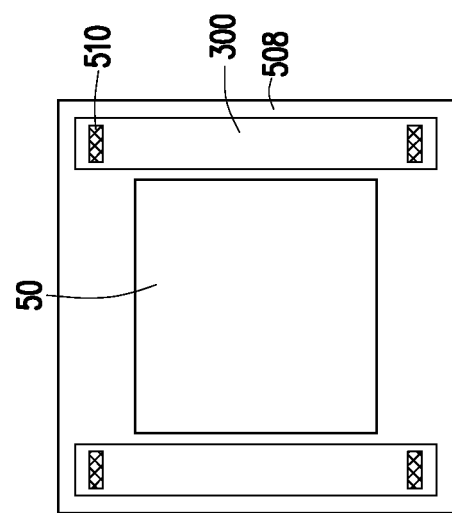
FIGS. 8A through 8C are plan views of a layer of a device package, in accordance with some embodiments.
Figure 8B:
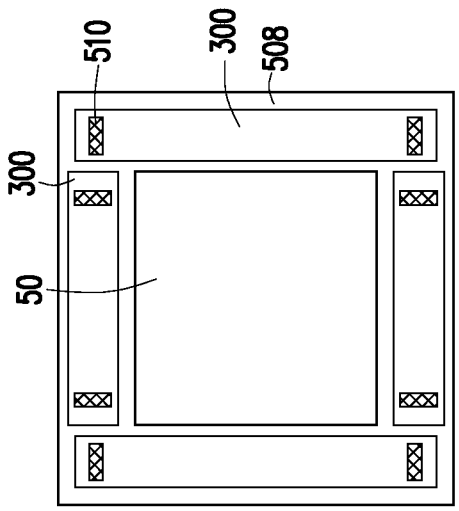
Figure 8C:
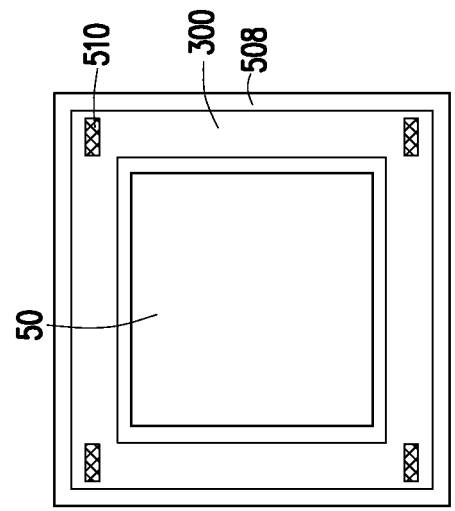

FIGS. 8A through 8C are plan views of one of the layers of a first device package 500 (see, e.g., FIGS. 5A through 5I), in accordance with some embodiments. The layout of the dummy devices 300 is shown relative to the integrated circuit device 50. The dummy devices 300 may be laid out in several manners, and may have several shapes. In some embodiments (e.g., FIG. 8A), the dummy devices 300 are laid out along two edges of the integrated circuit device 50. In some embodiments (e.g., FIG. 8B), the dummy devices 300 are laid out along four edges of the integrated circuit device 50. In some embodiments (e.g., FIG. 8C), a single dummy device 300 surrounds the integrated circuit device 50. Other dummy device layouts are also possible.

FIGS. 9A through 9H are various cross-sectional views of intermediate steps during a process for forming device packages, in accordance with some embodiments. In FIGS. 9A through 9H, a device stack 902 is formed by stacking multiple dummy devices and first integrated circuit devices on a second integrated circuit device. The first integrated circuit devices may have structures similar to the integrated circuit device 50 (see FIG. 1), and in an embodiment may be memory dies. The second integrated circuit devices may have structures similar to the integrated circuit device 50 (see FIG. 1), and in an embodiment may be logic dies. The dummy devices may have structures similar to the dummy devices 300 (see FIG. 3). The device stack 902 is tested after formation.

In FIG. 9A, first integrated circuit devices 904 are attached to a first carrier substrate 906. The first carrier substrate 906 may be formed from a silicon wafer or the like, and alignment marks 908 are formed in or over the silicon wafer. The alignment marks 908 may be formed in a similar manner as the alignment marks 310 of the dummy devices 300 (see FIG. 3). The first integrated circuit devices 904 may be placed on the first carrier substrate 906 and attached by bonding such as oxide-to-oxide bonding using the dielectric layers 60 of the first integrated circuit devices 904. The first integrated circuit devices 904 may be tested before they are attached, such that only known good dies are used for processing.

In FIG. 9B, a first encapsulant 912 is formed around the first integrated circuit devices 904. The first encapsulant 912 may be formed from a material selected from the candidate materials of the topmost encapsulant 110A (see FIG. 2B), or may include a different material. The first encapsulant 912 may be formed by a method selected from the candidate methods of forming the topmost encapsulant 110A, or may be formed by a different method. The first encapsulant 912 and first integrated circuit devices 904 are thinned by, e.g., a CMP, exposing the conductive vias 54 of the first integrated circuit devices 904.

Figure 9C:
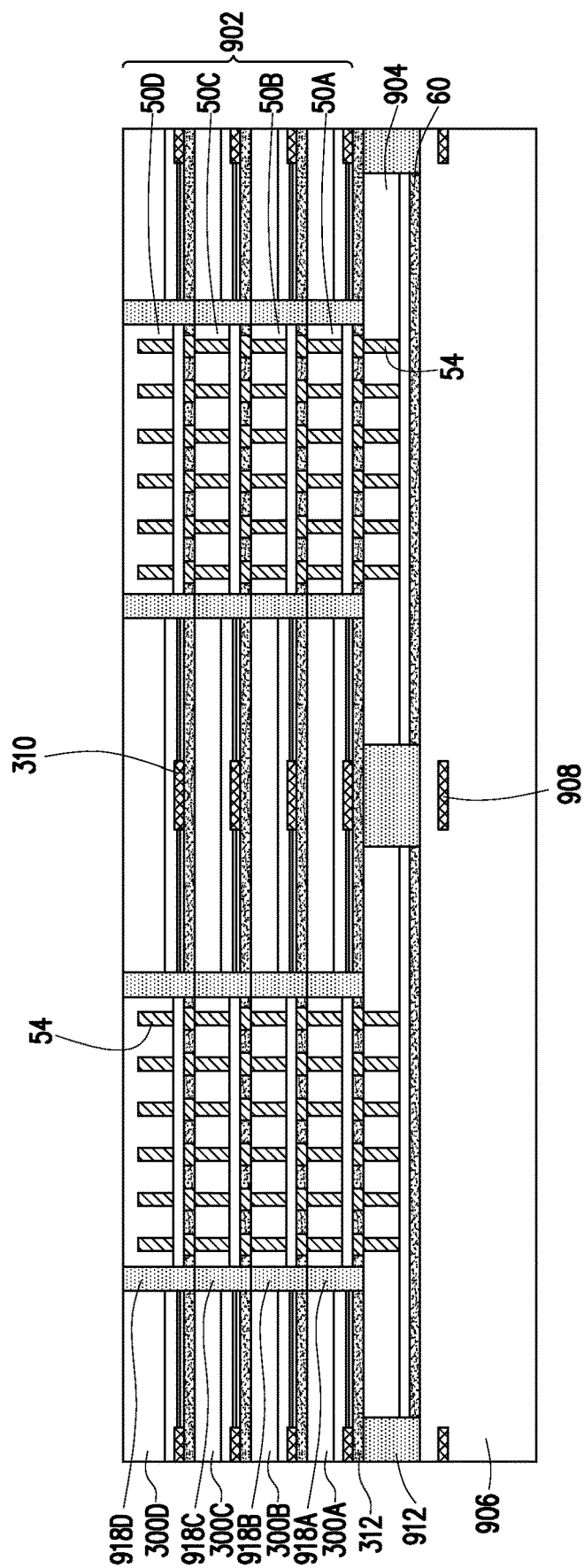

In FIG. 9C, the device stack 902 is formed on the first integrated circuit devices 904. The device stack 902 includes multiple layers of integrated circuit devices 50A-50D, dummy devices 300A-300D, and encapsulants 918A-918D. A bottommost layer of the integrated circuit devices 50D and dummy devices 300D may not be planarized, such that the conductive vias 54 of the integrated circuit devices 50D remain insulated. Each layer may be attached using, e.g., bonding such as oxide-to-oxide bonding. During placement, the alignment marks 310 of the dummy devices 300A-300D are aligned with the alignment marks 908 of the first carrier substrate 906.

Figure 9D:
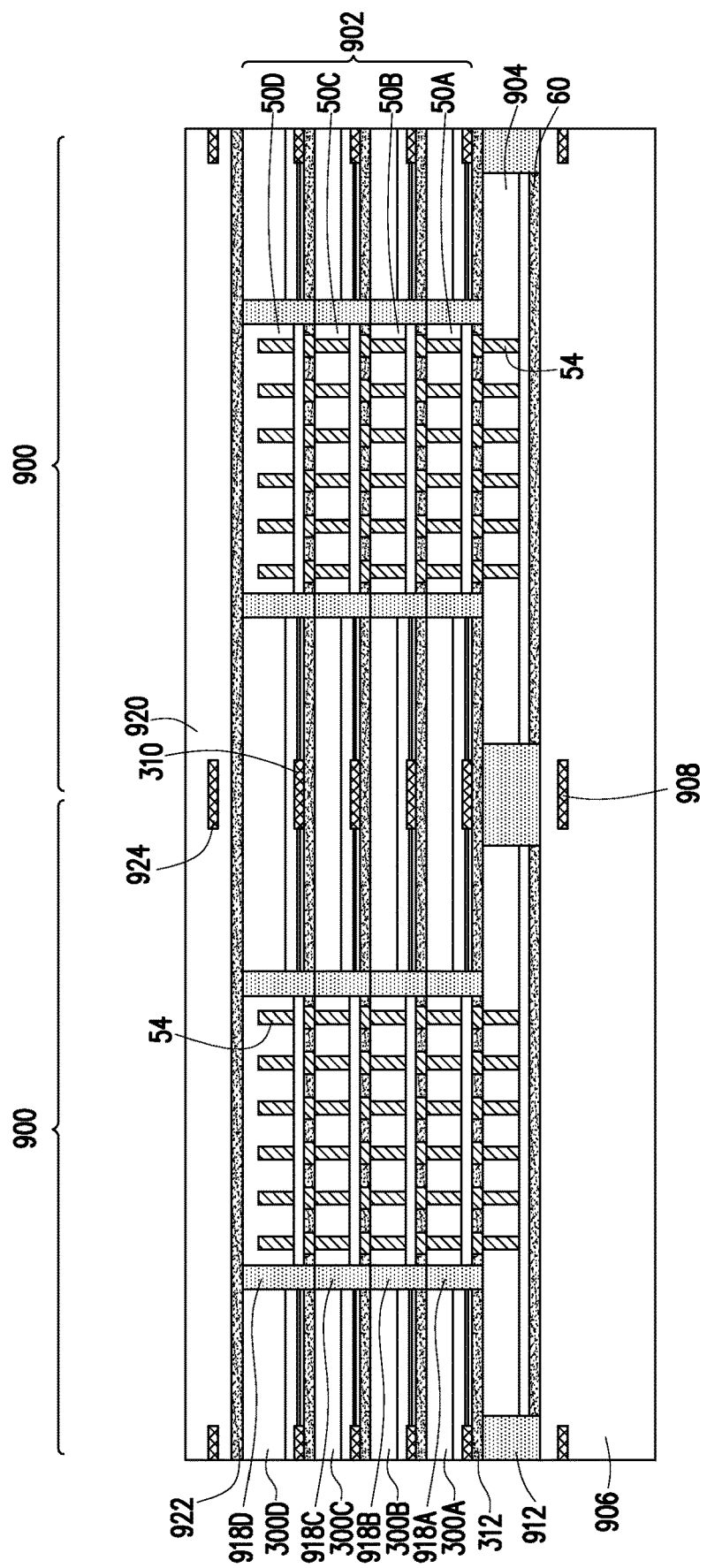

In FIG. 9D, a second carrier substrate 920 is attached to the device stack 902 by bonding such as oxide-to-oxide bonding using a dielectric layer 922, thereby forming first device packages 900. The second carrier substrate 920 may be formed from a material selected from the candidate materials of the second carrier substrate 112, or may include a different material. The second carrier substrate 920 includes alignment marks 924 which are aligned with the alignment marks 310 of the integrated circuit devices 50A-50D during placement.

Figure 9E:
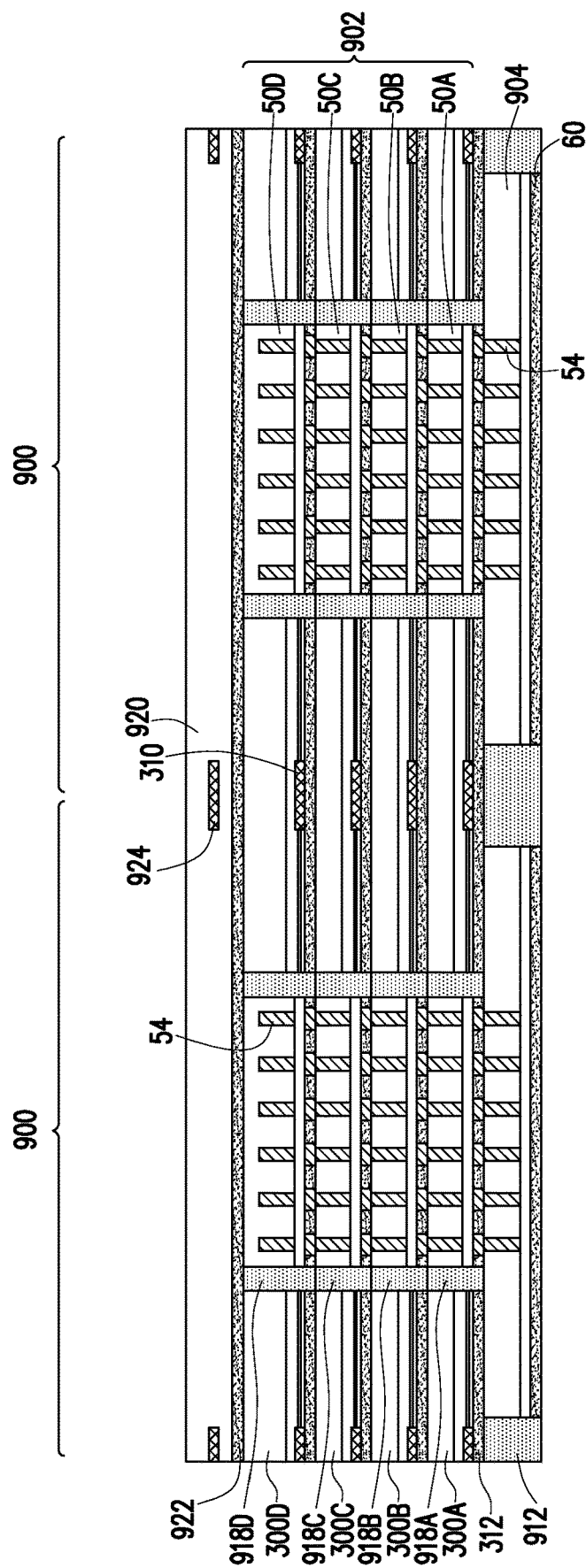

In FIG. 9E, the first carrier substrate 906 is removed from the first integrated circuit devices 904. In embodiments where the first carrier substrate 906 is a silicon wafer, the removal may be accomplished by etching or grinding away the silicon wafer and dielectric layer.

Figure 9F:
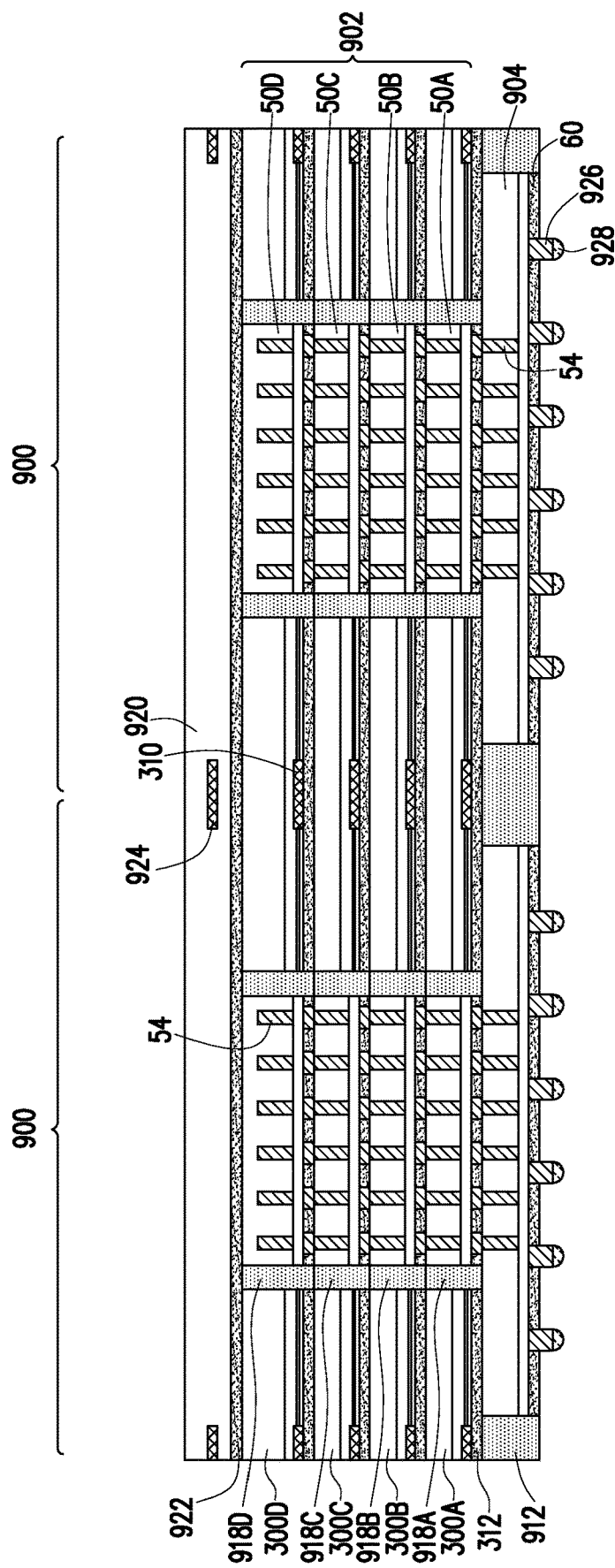

In FIG. 9F, openings are formed in the dielectric layers 60 of the first integrated circuit devices 904, and bumps 926 are formed in the openings. The bumps 926 may be formed from a material selected from the candidate materials of the bumps 126 (see FIG. 2K), or may include a different material. The bumps 926 may be formed by a method selected from the candidate methods of forming the bumps 126, or may be formed by a different method.

Conductive connectors 928 are then formed on the bumps 926. The conductive connectors 928 may be formed from a material selected from the candidate materials of the conductive connectors 128, or may include a different material. The conductive connectors 928 may be formed by a method selected from the candidate methods of forming the conductive connectors 128, or may be formed by a different method. The first device packages 900 may then be tested by a probe, using the conductive connectors 928, such that only known good devices are used for further processing.

Figure 9G:
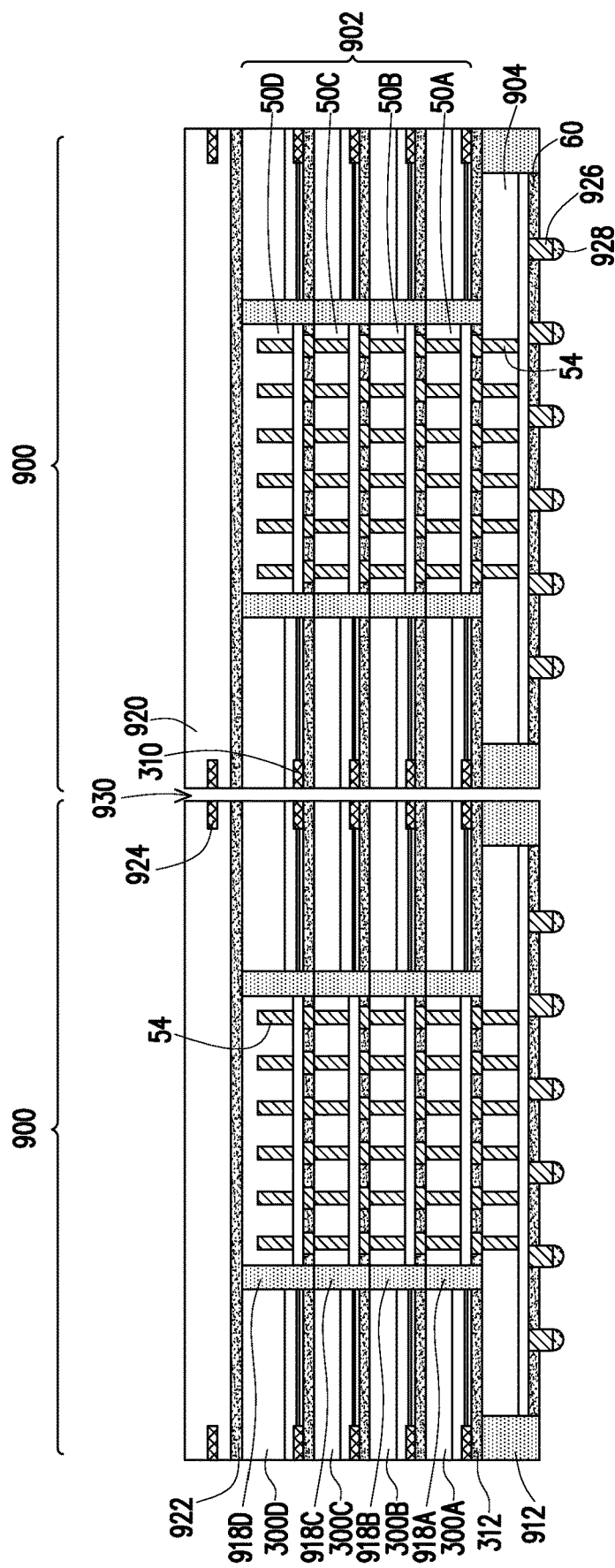

In FIG. 9G, the first device packages 900 are singulated from adjacent device packages. The singulation may be by, e.g., a sawing or laser cutting along scribe lines 930. The alignment marks 924 of the second carrier substrate 920 may be disposed along the scribe lines 930. As such, the singulation process may result in some of the alignment marks 924 being cut or removed, such that portions of the second carrier substrate 920 in the first device packages 900 have fragments or portions of the alignment marks 924.

Figure 9H:
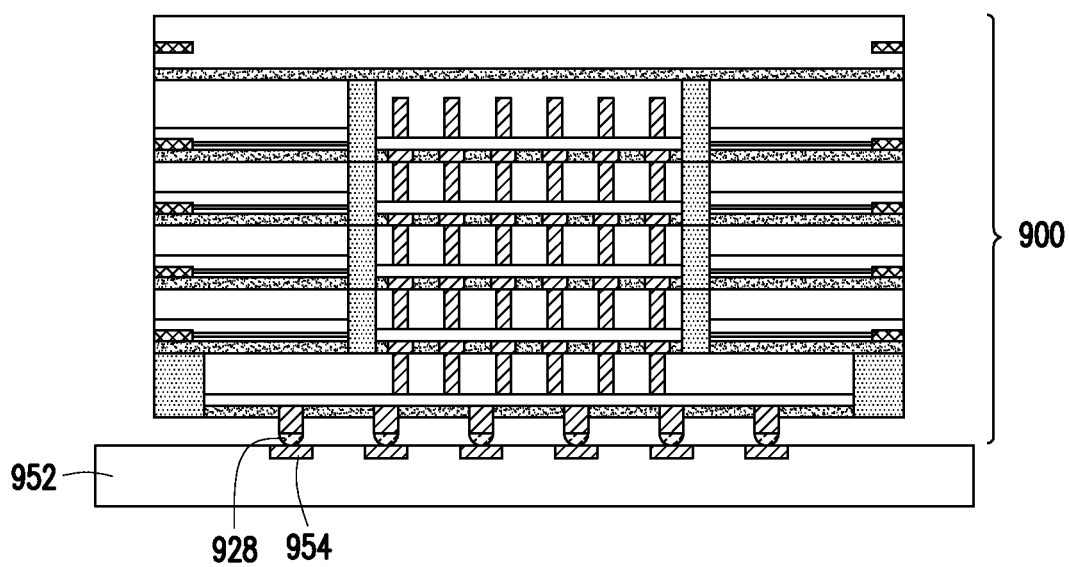

In FIG. 9H, second device packages 950 are formed by mounting the first device packages 900 to a package substrate 952. The package substrate 952 may be similar to the package substrate 152 (see FIG. 2L). The package substrate 952 may include metallization layers and vias (not shown) and bond pads 954 over the metallization layers and vias. The conductive connectors 928 of the first device packages 900 are coupled to the bond pads 954 of the package substrate 952 to form the second device packages 950.

Embodiments may achieve advantages. By testing the device stacks (such as memory cubes) before further processing, known good cubes may be used for processing, increasing device package yield. Further, use of the dummy devices in the device packages may improve the thermal performance of the resulting device packages. Finally, placing the alignment marks in the dummy devices may allow alignment marks to be omitted from the devices in the memory cube, which may increase the routing area of the devices in the memory cube.

In an embodiment, a method includes: stacking a plurality of first dies to form a device stack; revealing testing pads of a topmost die of the device stack; testing the device stack using the testing pads of the topmost die; and after testing the device stack, forming bonding pads in the topmost die, the bonding pads being different from the testing pads.

In some embodiments, the method further includes: after testing the device stack, covering the test pads of the topmost die. In some embodiments of the method, stacking the plurality of first dies includes: bonding the topmost die to a first carrier substrate, where during the bonding, the topmost die includes a dielectric layer over the testing pads, and is free from bonding pads; and stacking a bottommost die over the topmost die, where during the stacking, the bottommost die includes bonding pads and a dielectric layer over the bonding pads. In some embodiments of the method, bonding the topmost die to the first carrier substrate includes forming oxide-to-oxide bonds with the dielectric layer of the topmost die, and stacking the bottommost die over the topmost die includes performing hybrid bonding with the bonding pads and the dielectric layer of the bottommost die. In some embodiments of the method, stacking the plurality of first dies further includes: encapsulating the topmost die with a topmost encapsulant layer; and after encapsulating the topmost die, encapsulating the bottommost die with a bottommost encapsulant layer. In some embodiments of the method, stacking the plurality of first dies further includes: encapsulating a topmost dummy device with the topmost encapsulant layer; and after encapsulating the topmost dummy device, encapsulating a bottommost dummy device with the bottommost encapsulant layer. In some embodiments, the method further includes: forming alignment marks in the topmost dummy device and the bottommost dummy device. In some embodiments, the method further includes: forming alignment marks in the first carrier substrate; and aligning the alignment marks of the topmost and bottommost dummy devices with the alignment marks of the first carrier substrate. In some embodiments, the method further includes: bonding the bottommost die of the device stack to a second carrier substrate; and removing the device stack from the first carrier substrate. In some embodiments, the method further includes: bonding a second die to the topmost die of the device stack using the bonding pads.

In an embodiment, a method includes: bonding a first die to a first carrier substrate; stacking a plurality of second dies and a plurality of dummy devices on the first die to form a device stack; bonding a second carrier substrate to the plurality of second dies and the plurality of dummy devices of the device stack; removing the first carrier substrate from the first die; forming conductive bumps on the first die; testing the first die and the device stack using the conductive bumps of the first die; and singulating the second carrier substrate and portions of the dummy devices to form a first device package.

In some embodiments of the method, the first carrier substrate includes first alignment marks, where the dummy devices include second alignment marks, and further including: aligning the second alignment marks of the plurality of dummy devices with the first alignment marks of the first carrier substrate when stacking the dummy devices on the first die. In some embodiments of the method, the second carrier substrate includes third alignment marks, and further including: aligning the third alignment marks of the second carrier substrate with the second alignment marks of the plurality of dummy devices when bonding the second carrier substrate to the dummy devices. In some embodiments of the method, a first subset of the second alignment marks have a first shape, and a second subset of the second alignment marks have a second shape, the first and second subsets of the alignment marks being disposed in different layers of the device stack. In some embodiments of the method, singulating the portions of the dummy devices includes cutting the second alignment marks during singulation. In some embodiments, the method further includes: aligning the first die and the second dies over the first carrier substrate without use of alignment marks.

In an embodiment, a device includes: a first die having a first function; a device stack on the first die, the device stack including a plurality of layers, each of the layers including: a second die having a second function; a dummy device adjacent the second die, the dummy device including alignment marks; and an encapsulant disposed between the dummy device and the second die; and a first substrate on the device stack, the first substrate including alignment marks.

In some embodiments of the device, the dummy device of each of the layers includes alignment marks. In some embodiments of the device, the alignment marks in different ones of the layers have different shapes. In some embodiments of the device, the alignment marks of the dummy devices in each of the layers do not overlap in a plan view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    attaching a first memory die and a first dummy device to a first carrier substrate, the first carrier substrate comprising first alignment marks, the first dummy device comprising second alignment marks, wherein attaching the first dummy device comprises aligning the second alignment marks with a first subset of the first alignment marks;
    attaching a second memory die and a second dummy device to the first memory die and the first dummy device, respectively, the second dummy device comprising third alignment marks, wherein attaching the second dummy device comprises aligning the third alignment marks with a second subset of the first alignment marks, wherein the second dummy device and the first dummy device have different shapes in a top-down view, wherein the third alignment marks do not overlap the second alignment marks in the top-down view;
    testing the first memory die and the second memory die; and
    after testing the first memory die and the second memory die, attaching a logic die to the first memory die.

2. The method of claim 1, wherein the first dummy device is laid out along a single edge of the first memory die in the top-down view.

3. The method of claim 1, wherein the first dummy device is laid out along a plurality of edges of the first memory die in the top-down view.

4. The method of claim 1, wherein the first subset of the first alignment marks have different shapes than the second subset of the first alignment marks in the top-down view.

5. The method of claim 1, wherein a material of the first dummy device and the second dummy device is transparent to light used for aligning the second alignment marks and the third alignment marks.

6. The method of claim 1, further comprising:
removing the first carrier substrate before testing the first memory die and the second memory die.

7. The method of claim 1, further comprising:
attaching the logic die to a package substrate.

8. The method of claim 1, further comprising:
attaching a second carrier substrate to the second memory die and the second dummy device, the second carrier substrate comprising fourth alignment marks, wherein attaching the second carrier substrate comprises aligning the fourth alignment marks with the second alignment marks and the third alignment marks.

9. A method comprising:
attaching a second memory die and a second dummy device to a first memory die and a first dummy device, respectively, the first dummy device comprising first alignment marks, the second dummy device comprising second alignment marks, wherein the second alignment marks do not overlap the first alignment marks in a top-down view, wherein the second dummy device overlaps the first dummy device in the top-down view;
attaching a carrier substrate to the second memory die and the second dummy device, the carrier substrate comprising third alignment marks, wherein attaching the carrier substrate comprises aligning the third alignment marks with the first alignment marks and the second alignment marks;
testing the first memory die and the second memory die; and
singulating the carrier substrate, the first dummy device, and the second dummy device.

10. The method of claim 9, wherein singulating the first dummy device and the second dummy device comprises cutting the first alignment marks and the second alignment marks.

11. The method of claim 9, further comprising:
after testing the first memory die and the second memory die, attaching a logic die to the first memory die and the first dummy device.

12. The method of claim 11, further comprising:
attaching the logic die to a package substrate.

13. The method of claim 9, further comprising:
before testing the first memory die and the second memory die, attaching the first memory die and the first dummy device to a logic die.

14. The method of claim 13, further comprising:
attaching the logic die to a package substrate.

15. The method of claim 9, wherein the first alignment marks and the second alignment marks have different shapes in the top-down view.

16. The method of claim 9, wherein a material of the first dummy device and the second dummy device is transparent to light used for aligning the third alignment marks with the first alignment marks and the second alignment marks.

17. A method comprising:
attaching second memory dies and a second dummy device to first memory dies and a first dummy device, respectively, the first dummy device disposed between the first memory dies in a top-down view, the second dummy device disposed between the second memory dies in the top-down view;
attaching a first carrier substrate to the second memory dies and the second dummy device;
testing the first memory dies and the second memory dies; and
singulating the first carrier substrate, the first dummy device, and the second dummy device.

18. The method of claim 17, further comprising:
attaching the first memory dies and the first dummy device to a logic die.

19. The method of claim 17, further comprising:
attaching the first memory dies and the first dummy device to a second carrier substrate.

20. The method of claim 17, wherein the second dummy device and the first dummy device have different shapes in the top-down view.

* * * * *